US006885579B2

United States Patent
Sakimura et al.

(10) Patent No.: US 6,885,579 B2
(45) Date of Patent: Apr. 26, 2005

(54) MAGNETIC RANDOM ACCESS MEMORY INCLUDING A CELL ARRAY HAVING A MAGNETO-RESISTANCE ELEMENT

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/609,906

(22) Filed: Jul. 1, 2003

(65) Prior Publication Data

US 2004/0004856 A1 Jan. 8, 2004

(30) Foreign Application Priority Data

Jul. 4, 2002 (JP) ........................................ 2002-196575

(51) Int. Cl.[7] ............................................. G11C 11/00
(52) U.S. Cl. ........................ 365/158; 365/171; 365/173
(58) Field of Search ................................. 365/158, 171, 365/173, 210, 230.06

(56) References Cited

U.S. PATENT DOCUMENTS 5,640,343 A * 6/1997 Gallagher et al. .......... 365/171

6,169,688 B1 * 1/2001 Noguchi ..................... 365/171

FOREIGN PATENT DOCUMENTS

| JP | 6-29494 | 2/1994 |
|---|---|---|
| JP | 6-342598 | 12/1994 |
| JP | 11-39858 | 2/1999 |
| JP | 2000-315383 | 11/2000 |
| JP | 2001-273756 | 10/2001 |
| JP | 2002-8369 | 1/2002 |

* cited by examiner

Primary Examiner—Gene N. Auduong
(74) Attorney, Agent, or Firm—Young & Thompson

(57) ABSTRACT

In a magnetic random access memory, a cross point cell array of memory cells is arranged in a matrix of columns and rows, and each of the memory cells has a magneto-resistance element. A column of dummy memory cells is provided, and each of the dummy memory cells has a magneto-resistance element. Word lines are provided for the rows of the memory cells and the dummy memory cells, respectively, and bit lines are provided for the columns of the memory cells, respectively. A dummy bit line is provided for the column of dummy memory cells. A read circuit is connected with the cross point cell array and the dummy bit line.

40 Claims, 20 Drawing Sheets

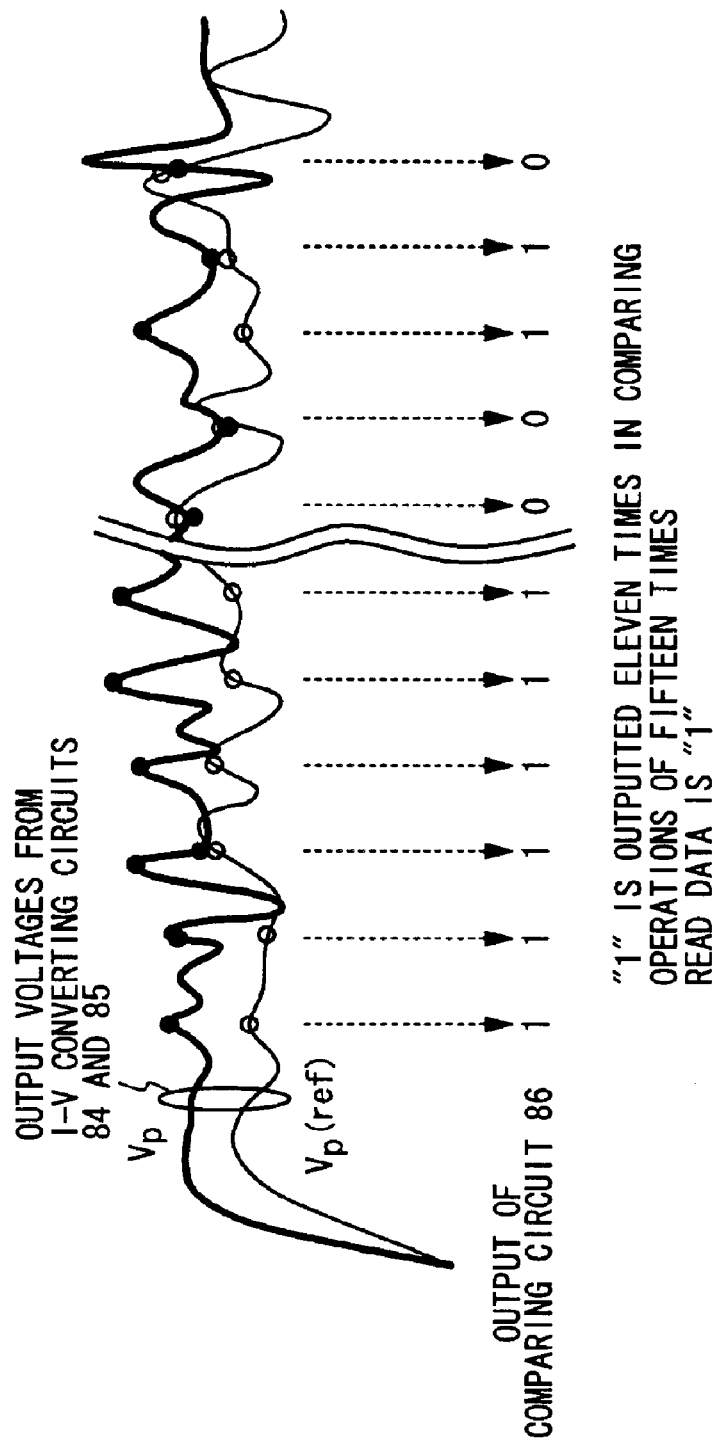

MAGNETIC RANDOM ACCESS MEMORY INCLUDING A CELL ARRAY HAVING A MAGNETO-RESISTANCE ELEMENT

BACKGROUND OF THE INVENTION

1. Field of the Invention

The present invention relates to a magnetic random access memory (MRAM), especially to a technique to determine more surely data stored in a memory cell of MRAM.

2. Description of the Related Art

A magnetic random access memory (MRAM) collects attention as a new nonvolatile memory that it is possible a high-speed writing operation and the number of times of rewrite is large. A typical MRAM contains a memory cell array in which a plurality of memory cells are arranged in a matrix. Each memory cell contains a magnetoresistance device which is composed of a pin layer having fixed spontaneous magnetization, a free layer having spontaneous magnetization whose direction can be inverted, and a spacer layer interposed between the pin layer and the free layer.

The free layer is formed such that the direction of the spontaneous magnetization of the free layer can be set to a same direction (hereinafter, to be referred to as a parallel direction) or an opposite direction (hereinafter, to be referred to as an antiparallel direction) as or to the direction of the spontaneous magnetization of the pin layer. That is, the memory cell stores 1-bit data as a relation of the direction of the spontaneous magnetization of the free layer and the direction of the spontaneous magnetization of the pin layer. The memory cell can take two states: namely, a "parallel direction" state that the direction of the spontaneous magnetization of the free layer and the direction of the spontaneous magnetization of the pin layer are same, and an "antiparallel direction" state that the direction of the spontaneous magnetization of the free layer and the direction of the spontaneous magnetization of the pin layer are opposite to each other. The memory cell stores the 1-bit data as "1" in case of one of the parallel state and the anti-parallel state and as "0" in case of the other state.

The direction of the spontaneous magnetization in the free layer and the pin layer has an influence on the resistance of the memory cell. When the directions of the spontaneous magnetization in the pin layer and the free layer are in the parallel state, the resistance of the memory cell is a first value R, and when being the anti-parallel, the resistance of the memory cell is a second value R+ΔR. The directions of the spontaneous magnetization in the free layer and the pin layer, i.e., the data stored in the memory cell can be determined by detecting the resistance of the memory cell. The resistance of the memory cell can be detected based on either of an electric current which flows through the magnetoresistance device by applying a predetermined voltage to a magnetoresistance device or a voltage generated in the magnetoresistance device by flowing electric current through the magnetoresistance device.

As the structure of the memory cell in the magnetic random access memory, two methods are known: one method that the magnetoresistance device is connected with a bit line through an access transistor and the other method that the magnetoresistance device is directly connected with a word line and the bit line. The latter is inferior to the former in the selectivity of the memory cell but is suitable for high integration. The array composed of the memory cells in the latter is known as a cross point cell array.

Parasitic electric current (or sneak path electric current) is given as a factor that damages the reliability of determination of data stored in a memory cell of the magnetic random access memory adopting a cross point cell array. The memory cells in the cross point cell array are linked in many parallel routes. The sneak path electric current flows through the memory cells as a read object through the parallel routes without passing it. The sneak path electric current hinders the correct detection of the resistance of the memory cell when the data stored in the memory cell is determined.

A magnetic random access memory is disclosed in Japanese Laid Open Patent Application (JP-P 2002-8369), in which the resistance of a memory cell in the cross point cell array is detected in a high reliability while restraining an influence of the sneak path electric current. FIG. 1 is a schematic diagram showing the conventional magnetic random access memory. The magnetic random access memory contains a resistive cross point array 110 composed of a plurality of memory cells 112. The resistive cross point array 110 contains a plurality of word lines 114 extending in a row direction and a plurality of bit lines 116 extending into a column direction. Each of the memory cells 112 is located on the intersection of the word line 114 and the bit line 116. The word line 114 is connected with a row decoder circuit 118 which selects one of the plurality of word lines 114. The bit line 116 is connected with a detection circuit 120. The detection circuit 120 is composed of direction control circuits 122, each of which selects one of the plurality of bit lines 116, a sense amplifier 124 for each direction control circuit 122, a data register 130 for each sense amplifier 124 and an input/output pad 132 for each data register 130.

A read operation of the magnetic random access memory is carried out as follows. That is, one word line 114 is selected by the row decoder circuit 118 and one bit line 116 is selected by the direction control circuit 122. The memory cell 112 located on the intersection of the selected word line 114 and the selected bit line 116 is selected.

FIG. 2 shows an equivalent circuit of the resistive cross point array 110 at the time of the data read. The selected memory cell is shown by a first resistor 112a and the memory cells which are not selected are expressed by the second, third, and fourth resistors 112b, 112c and 112d. The second resistor 112b represents a not-selected memory cell along the selected bit line, the third resistor 112c represents a not-selected memory cell along the selected word line and the fourth resistor 112d represents not-selected other memory cells.

An operation potential Vs is applied to the selected bit line, and a ground potential is applied to the selected word line. Thus, a detection electric current Is flows through the first resistor 112a. The operation potential Vb which is the same as the operation potential Vs is applied to the bit line which is not selected, to restrain the influence of sneak path electric current. The sneak electric currents S1 and S3 which respectively flow through the second resistor 112b and the fourth resistor 112d are blocked off by the application of the operation potential Vb. Moreover, the sneak path electric current S2 which flows through the third resistor 112c is led to the ground potential. Therefore, it does not interfere with the detection electric current Is. In this way, the detection electric current Is can be detected in a high reliability.

Alternatively, the same operation potential Vb as the operation potential Vs is applied to the word line which is not selected, as shown in FIG. 3. Thus, the sneak path electric current S1 is blocked off so as not to flow through the second resistor 112b. The sneak path electric current S2 which flows through the third resistor 112c and the sneak path electric current S3 which flows through the fourth resistor 112d are led to the ground potential. Therefore, they do not interfere with the detection electric current Is. In this way, the detection electric current Is can be detected in a high reliability.

By applying the operation potential Vb which is the same as the operation potential Vs to the bit line which is not selected, or by applying the operation potential Vb which is the same as the operation potential Vs to the word line which is not selected, the detection electric current Is can be detected in a precision. Therefore, the data stored in the selected memory cell can be detected in a high reliability.

In the above-mentioned magnetic random access memory, it is important that the operation voltage Vb which is applied to the word line (or the bit line) which is not selected and the operation voltage Vs which is applied to the selected bit line are coincident with each other in a high precision. A little difference between the operation voltage Vb and the operation voltage Vs conspicuously increases the influence of the sneak path electric currents S1 to S3 on the detection electric current Is. Especially, when the memory cell has a short-circuit in a part because of a problem on a manufacturing process, the little difference between the operation voltage Vb and the operation voltage Vs generates a large sneak path electric current.

However, it is difficult in practice to coincide the operation voltage Vb with the operation voltage Vs totally. The difficulty to coincide the operation voltage Vb and the operation voltage Vs totally decreases the effect of the restraint of the influence of the sneak path electric current.

It is demanded that the data stored in the memory cell of the magnetic random access memory can be read in a high reliability, excluding the influence of the sneak path electric current.

In conjunction with the above description, a circuit to confirm a write state of a flash memory device is disclosed in Japanese Laid Open Patent Application (JP-A-Heisei 6-29494). The circuit of this conventional example is applied to an EEPROM array which has a plurality of memory cells. The memory cell is formed on a silicon substrate to have a floating gate. The floating gates of the memory cells are connected with one of a plurality of word lines. The circuit to confirm a write state of the memory cell contains a first circuit which generates a first reference electric current. The first circuit is connected to the word line, and has a first threshold potential which is set to a first fixed level. A memory cell electric current is generated in response to a gate potential applied to the word line. Also, when the gate potential is larger than the first threshold potential, the first reference current is generated. A detection circuit is connected with the memory cell to respond the first reference electric current. The detection circuit confirms a program state when the memory cell electric current is larger than the first reference the electric current.

Also, a non-volatile semiconductor memory device is disclosed in Japanese Laid Open Patent Application (JP-A-Heisei 6-342598). The non-volatile semiconductor memory device of this conventional example contains a memory cell array in which memory cells of non-volatile transistors are arranged in a matrix, and a dummy cell which has a transistor structure. A read potential generating circuit applies a predetermined potential to a selected one of the memory cells such that a read potential corresponding to the data stored in the selected memory cell is generated based on the electric current flowing through the selected memory cell. A reference potential generating circuit applies a predetermined potential to the dummy cell such that a reference potential is generated based on the electric current flowing through the dummy cell. A reference potential falling circuit falls the reference potential for a first predetermined time after change from a standby state into an operating state. An amplification circuit compares the read potential and the reference potential after a second predetermined time after the change from a standby state into the operating state and amplifies and output an output according to the comparison result.

Also, a semiconductor memory device is disclosed in Japanese Laid Open Patent Application (JP-A-Heisei 11-39858). In the semiconductor memory device of this conventional example, a sub cell block is composed of a single memory cell which is provided at intersection of a word line and a bit line and stores data through a resistance change. Alternatively, the sub cell block is composed of a plurality of memory cells which are connected in series in a direction of the bit line. A cell block is composed of a plurality of sub cell blocks which are connected in series in the direction of the bit line. A memory cell array is composed of a plurality of cell blocks which are provided in a direction of the word line. A circuit supplies an electric current to the cell block in the bit line direction. A read circuit reads data from nodes at both ends of the sub cell block which contains the memory cell of the sub cell block which is selected by the word line.

Also, a magnetic random access memory device is disclosed in Japanese Laid Open Patent Application (JP-P2001-273756A). The magnetic random access memory device is composed of an array which contains a plurality of columns of memory cells and at least one column of reference cells, a plurality of bit lines which extend to connect memory cells from one memory cell of each column to the reference cell, and a read circuit which detects a resistance state of the selected memory cell in the array. The read circuit contains a plurality of steering circuit which have inputs connected to the plurality of bit lines, respectively. A plurality of differential amplifiers are provided for the steering circuits and each of the plurality of differential amplifiers has a sense node and a reference node. Each of a plurality of first electric current mode preamplifiers is connected between the output of a corresponding one of the steering circuits and the sense node of corresponding one of the differential amplifiers. A plurality of second electric current mode preamplifiers are connected between the standard nodes of the differential amplifiers and the bit lines, respectively.

Also, a magnetic random access memory device is disclosed in Japanese Laid Open Patent Application (JP-P2000-315383A). The magnetic random access memory device of this conventional example is composed of a row decoder which decodes a part of an address, a column decoder which decodes the remaining part of the address, a plurality of pairs of sense lines, each pair being connected with a decoding terminal of the row decoder, a plurality of word lines connected with decoding terminals of the column decoder, and a plurality of cell pairs. Both of the sense lines of the pair are provided adjacent to each other and the cell pair is composed of a memory cell and a reference cell which are provided adjacent to each other. The memory cell and the reference cell have magnetoresistance elements, respectively. The pairs of the sense lines and the plurality of word lines intersect in a matrix. In the intersection, the memory cell is connected with one of the sense lines and the word line and the reference cell is connected the other of the sense line and the word line.

SUMMARY OF THE INVENTION

Therefore, an object of the present invention is to provide the technique to read the data stored in a memory cell of a magnetic random access memory in a high reliability.

Another object of the present invention is to provide the technique to read the data stored in the memory cell of the magnetic random access memory in the high reliability by restraining the influence of the sneak path electric current.

In an aspect of the present invention, a magnetic random access memory include a cross point cell array of memory cells arranged in a matrix of columns and rows, and each of the memory cells has a magneto-resistance element. A column of dummy memory cells is provided, and each of the dummy memory cells has a magneto-resistance element. Word lines are provided for the rows of the memory cells and the dummy memory cells, respectively, and bit lines are provided for the columns of the memory cells, respectively. A dummy bit line is provided for the column of dummy memory cells. A read circuit is connected with the cross point cell array and the dummy bit line. A selected memory cell as one of the memory cells is connected with a selected word line and a selected bit line, and a selected dummy memory cell is connected with the dummy bit line and the selected word line. When the selected memory cell is selected from among the memory cells in a read operation, the read circuit determines data stored in the selected memory cell using a difference between a detection electric current which flows through the selected bit line, the selected memory cell and the selected word line and a dummy bit line electric current which flows through the dummy bit line and the selected dummy memory cell.

Here, a first voltage is applied from the read circuit to the selected bit line and the dummy bit line, and a second voltage is applied to the selected word line. In this case, the magnetic random access memory may further include a first selector interposed between the read circuit and the cross point cell array to select the selected bit line from among the bit lines such that the selected bit line and the dummy bit line are connected with the read circuit, and non-selected bit lines as ones of the bit lines other than the selected bit line are not connected with the read circuit.

Also, the magnetic random access memory may further include a second selector connected with the word lines to select the selected word line from among the word lines such that the first voltage is applied to the selected word line and is not applied to non-selected word lines as ones of the word lines other than the selected word lines.

Also, the non-selected bit lines may be set to a floating state. Alternatively, the non-selected bit lines may be applied with a third voltage. It is desirable that the third voltage is substantially the same as the first voltage. In this case, the magnetic random access memory may further include a third selector connected with the bit lines and the dummy bit line to select the non-selected bit lines. The third voltage may be applied to the non-selected bit lines, and not be applied to the selected bit line and the dummy bit line.

Also, the read circuit may include a removing circuit provided to generate a difference signal corresponding to the difference between the detection electric current and the dummy bit line electric current; and a data determining circuit which determines the data stored in the selected memory cell using the difference signal. In this case, the data determining circuit may include an electric current-voltage converting circuit which outputs an output voltage corresponding to the difference signal; and a determining circuit which determines the data stored in the memory cell using the output voltage.

Also, the magnetic random access memory may further include a column of redundant dummy cells; a redundant dummy bit line provided for the column of redundant dummy cells; and a redundant circuit which contains a substitution data holding unit which holds substitution data. The redundant circuit connects the column of redundant dummy cell to the read circuit based on the substitution data instead of the dummy cell column.

Also, the column of dummy memory cells may be interposed between the columns of memory cells. Also, the column of redundant dummy memory cells may be interposed between the columns of memory cells.

Also, the magnetic random access memory may further include a row of reference memory cells connected with the bit lines and the dummy bit line, and each of the reference memory cells has a magneto-resistance element and storing predetermined data. Also, the magnetic random access memory may further include a reference word line provided for the row of reference memory cells. When one of the reference memory cells connected with the bit lines is selected, the reference memory cell connected with the dummy bit line is a reference dummy memory cell. The read circuit determines the data stored in the selected memory cell using a difference between a reference detection electric current which flows through the selected bit line, the selected reference memory cell and the reference word line and a reference dummy bit line electric current which flows through the dummy bit line, the reference dummy memory cell and the reference word line, in addition to the difference between the detection electric current and the dummy bit line electric current. In this case, the read circuit may include a removing circuit provided to generate a difference signal corresponding to the difference between the detection electric current and the dummy bit line electric current, and to generate a reference difference signal corresponding to the difference between the reference detection electric current and the reference dummy bit line electric current. A data determining circuit determines the data stored in the selected memory cell based on the difference signal and the reference difference signal. In this case, the data determining circuit may include an electric current-voltage converting circuit which outputs a first output voltage corresponding to the difference signal and a second output voltage corresponding to the reference difference signal. A holding circuit holds the first output voltage; and a determining circuit determines the data stored in the memory cell based on the first output voltage from the holding circuit and the second output voltage.

Also, the read circuit may include a first electric current-voltage converting circuit which outputs a first output voltage corresponding to the detection electric current in the read operation; and a second electric current-voltage converting circuit which outputs a second output voltage corresponding to the dummy bit line electric current in the read operation. A comparing circuit compares the first output voltage and the second output voltage and selectively output a predetermined data based on the comparison result in the read operation. A determining circuit determines the data stored in the selected memory cell based on the number of times of the output of the predetermined data from the comparing circuit. In this case, it is desirable that the number of times of the read operation is odd times. Also, in the read operation, the read circuit determines that the data stored the memory cell is "1" when the number of times when the data stored in the memory cell is determined as "1" is equal to or more than when the number of times when the data stored in the memory cell is determined as "0", and determines that the data stored the memory cell is "1" when the number of times when the data stored in the memory cell is determined as "1" is equal to or more than when the number of times when the data stored in the memory cell is determined as "0".

Also, the determining circuit contains a counter of n bits, and the number of times of the read operation is $2^n-1$ times. The counter is incremented by one every time the data stored in the memory cell is determined as "1", and the counter outputs the most significant bit as the data stored in the selected memory cell after $2^n-1$ times of the read operation is carried out.

Also, the reference memory cell has a reference cell free layer for holding the predetermined data based on a direction of spontaneous magnetization of the reference cell free layer, the memory cell has a memory cell free layer for holding the data based on a direction of spontaneous magnetization of the memory cell, and the reference memory cell free layer and the memory cell free layer are different in area size from each other. In this case, it is desirable that the reference memory cell free layer is smaller in area than the memory cell free layer. Also, the following equation is met:

$$a_{ref}/b_{ref} < a_{cell}/b_{cell}$$

where $b_{cell}$ is a length of the memory cell free layer in a direction of the spontaneous magnetization of the memory cell free layer, $a_{cell}$ is a length of the memory cell free layer in direction perpendicular to the direction of the spontaneous magnetization of the memory cell free layer, $b_{ref}$ is a length of the reference memory cell free layer in a direction of the spontaneous magnetization of the reference memory cell free layer, and $a_{ref}$ is a length of the reference memory cell free layer of in direction perpendicular to the direction of the spontaneous magnetization of the reference memory cell free layer.

Also, a resistance value of the reference memory cell is selected to be between a larger resistance value of a resistance value of the memory cell and a smaller resistance value.

In another aspect of the present invention, a magnetic random access memory may include a plurality of cells, and a read circuit. Each of the plurality of cells has invertible spontaneous magnetization and contains a magnetoresistance element whose resistance changes depending on a direction of the spontaneous magnetization. The plurality of cells contain memory cells, each of which has a memory cell free layer storing a data of "1" or "0" depending on a direction of spontaneous magnetization of the memory cell free layer, and reference cells, each of which has a reference cell free layer storing a predetermined data depending on a direction of spontaneous magnetization of the reference cell. The reference cell free layer and the memory cell free layer are different in area size from each other, and the read circuit takes out memory cell electric current from the memory cell, and reference cell electric current from the reference cell, and determines the data stored in the memory cell based on the memory cell electric current and the reference cell electric current.

Here, it is desirable that the reference cell free layer is smaller in area than the memory cell free layer. In this case, the following equation is met:

$$a_{ref}/b_{ref} < a_{cell}/b_{cell}$$

where $b_{cell}$ is a length of the memory cell free layer in a direction of the spontaneous magnetization of the memory cell free layer, $a_{cell}$ is a length of the memory cell free layer in direction perpendicular to the direction of the spontaneous magnetization of the memory cell free layer, $b_{ref}$ is a length of the reference cell free layer in a direction of the spontaneous magnetization of the reference cell free layer, and $a_{ref}$ is a length of the reference cell free layer of in direction perpendicular to the direction of the spontaneous magnetization of the reference cell free layer.

Also, a resistance value of the reference memory cell is selected to be between a larger resistance value of a resistance value of the memory cell and a smaller resistance value.

In another aspect of the present invention, a magnetic random access memory include a plurality of cross point cell arrays arranged in a matrix; a decoder provided for the plurality of cross point cell arrays to decode an address; and a plurality of read circuits, each of which is provided for one column of the plurality of cross point cell arrays. Each of the plurality of cross point cell arrays includes memory cells arranged in a matrix of columns and rows, each of the memory cells having a magneto-resistance element; a column of dummy memory cells, each of the dummy memory cells having a magneto-resistance element; word lines provided for the rows of the memory cells and the dummy memory cells, respectively; bit lines provided for the columns of the memory cells, respectively; and a dummy bit line provided for the column of dummy memory cells. Also, the cross point cell array includes a first selector provided to select a selected word line as one of the word lines based on a decoding result of the decoder and to connect the selected bit line and the dummy bit line with the read circuit; and a second selector provided to select a selected bit line as one of the bit lines and the dummy bit line based on the decoding result of the decoder. A selected memory cell as one of the memory cells is connected with the selected word line and the selected bit line, a selected dummy memory cell is connected with the selected word line, ones of the word lines other than the selected word line are non-selected word lines, ones of the bit lines other than the selected bit line are non-selected bit lines, and one of the memory cells other than the selected memory cell are non-selected memory cells. When the selected memory cell is selected from among the memory cells in one of the plurality of cross point cell arrays in a read operation, the read circuit determines data stored in the selected memory cell using a difference of a detection electric current which flows through the selected bit line, the selected memory cell and the selected word line and a dummy bit line electric current which flows through the dummy bit line, the selected dummy memory cell and the selected word line.

Here, the read circuit applies a first voltage is applied to the selected bit line and the dummy bit line, and does not apply the first voltage to the non-selected bit lines, and the first selector applies a second voltage is applied to the selected word line and does not apply the second voltage to the non-selected word lines. In this case, the non-selected bit lines may be set to a floating state. Alternatively, the magnetic random access memory may further include a third selector provided to apply a third voltage to the non-selected bit lines. The third voltage is substantially the same as the first voltage.

Also, each of the cross point cell arrays further may include a column of redundant dummy cells; a redundant dummy bit line provided for the column of redundant dummy cells; and a redundant circuit which contains a substitution data holding unit which holds substitution data. The redundant circuit connects the redundant dummy cell column to the read circuit based on the substitution data instead of the dummy cell column.

Also, the column of dummy memory cells may be interposed between the columns of memory cells of each of the cross point cell arrays. Also, the column of redundant dummy memory cells may be interposed between the columns of memory cells of each of the cross point cell arrays.

Also, each of the cross point cell arrays further may include a row of reference memory cells connected with the bit lines and the dummy bit line, each of the reference memory cells having a magneto-resistance element, and storing predetermined data; and a reference word line provided for the row of reference memory cells.

Also, when one of the reference memory cells connected with the bit lines is selected, the reference memory cell connected with the dummy bit line is a reference dummy memory cell. The read circuit determines data stored in the selected memory cell using a difference of a reference detection electric current which flows through the selected bit line and the selected reference memory cell and a reference dummy bit line electric current which flows through the dummy bit line and the selected reference dummy memory cell, in addition to the difference of the detection electric current which flows through the selected bit line and the selected memory cell and the dummy bit line electric current which flows through the dummy bit line and the selected dummy memory cell.

Also, the magnetic random access memory may further include a plurality of redundant cell arrays; a redundancy circuit; a redundant decoder; and a redundant read circuit provided for each of plurality of redundant cell arrays. Each of the plurality of redundant cell arrays may include redundant memory cells arranged in a matrix of columns and rows, each of the redundant memory cells having a magneto-resistance element, and a column of redundant dummy memory cells, each of the redundant dummy memory cells having a magneto-resistance element. Redundant word lines are provided for the rows of the memory cells and the redundant dummy memory cells, respectively, and redundant bit lines are provided for the columns of the redundant memory cells, respectively. A redundant dummy bit line is provided for the column of redundant dummy memory cells. A first redundant selector is provided to select a selected redundant word line as one of the redundant word lines based on a decoding result of the decoder and to connect the selected redundant bit line and the redundant dummy bit line with the redundant read circuit; and a second redundant selector is provided to select a selected redundant bit line as one of the redundant bit lines and the redundant dummy bit line based on the decoding result of the redundant decoder. The redundancy circuit may include a fuse circuit which holds a substitution data, and activates one of the plurality of redundant cell arrays when the substitution data and a part of the address are coincident with each other.

In another aspect of the present invention, a method of read data from a selected memory cell in a magnetic random access memory, is achieved by applying first and second voltages to the selected memory cell and a selected dummy memory cell, wherein the selected memory cell is connected with a selected bit line and a selected word line, and the selected dummy memory cell is connected with a dummy bit line and the selected word line; by calculating a first difference of a first detection electric current which flows through the selected bit line, the selected memory cell and the selected word line and a first dummy bit line electric current which flows through the dummy bit line, the selected dummy memory cell and the selected word line; by converting the first difference into a first output voltage and holding the first output voltage; by writing one of predetermined two data in the selected memory cell; by applying the first and second voltages to the selected memory cell and the dummy memory cell; calculating a second difference of a second detection electric current which flows through the selected bit line and the selected memory cell and a second dummy bit line electric current which flows through the dummy bit line and the selected dummy memory cell; by converting the second difference into a second output voltage; by comparing the first output voltage and the second output voltage; by outputting the one predetermined data when the first output voltage is coincident with the second output voltage, and by when the first output voltage is not coincident with the second output voltage, outputting the other predetermined data and writing the other predetermined data into the selected memory cell.

In another aspect of the present invention, a method of read data from a selected memory cell in a magnetic random access memory, is achieved by applying first and second voltages to the selected memory cell and a first selected dummy memory cell, wherein the selected memory cell is connected with a selected bit line and a first selected word line, and the first selected dummy memory cell is connected with a dummy bit line and the first selected word line; by calculating a first difference of a first detection electric current which flows through the selected bit line, the selected memory cell and the first selected word line and a first dummy bit line electric current which flows through the dummy bit line, the selected dummy memory cell and the first selected word line; by converting the first difference into a first output voltage and holding the first output voltage; by applying the first and second voltages to a selected reference memory cell and a second selected dummy memory cell, wherein the selected reference memory cell is connected with the selected bit line and a second selected word line, and the second selected dummy memory cell is connected with the dummy bit line and the second selected word line; by calculating a second difference of a second detection electric current which flows through the selected bit line, the selected reference memory cell and the second selected word line and a second dummy bit line electric current which flows through the dummy bit line, the second selected dummy memory cell and the second selected word line; by converting the second difference into a second output voltage; by comparing the first output voltage and the second output voltage; by outputting one of predetermined two data based on the comparing result.

In another aspect of the present invention, a method of reading data from a selected memory cell in a magnetic random access memory, is achieved by (a) applying first and second voltages to the selected memory cell and a selected dummy memory cell, wherein the selected memory cell is connected with a selected bit line and a selected word line, and the selected dummy memory cell is connected with a dummy bit line and the selected word line; by (b) converting into a first voltage, a detection electric current which flows through the selected bit line, the selected memory cell and the selected word line; by (c) converting into a second voltage, a first dummy bit line electric current which flows through the dummy bit line, the selected dummy memory cell and the selected word line; by (d) outputting "1" when the first voltage is equal to or larger than the second voltage; by (e) counting up a count by one; by carrying out (a) to (e) an odd times; and by determining that the data stored in the selected memory cell is "1" when the number of times when the data stored in the selected memory cell is determined as "1" is equal to or more than when the number of times when the data stored in the memory cell is determined as "0" and determining that the data stored the memory cell is "1" when the number of times when the data stored in the memory cell is determined as "1" is equal to or more than when the number of times when the data stored in the memory cell is determined as "0".

BRIEF DESCRIPTION OF THE DRAWINGS

FIG. 20 is a diagram showing an operation of the magnetic random access memory according to the fourth embodiment of the present invention.

DESCRIPTION OF THE PREFERRED EMBODIMENTS

Hereinafter, a magnetic random access memory of the present invention will be described with reference to the attached drawings.

(First Embodiment)

Figure 1:
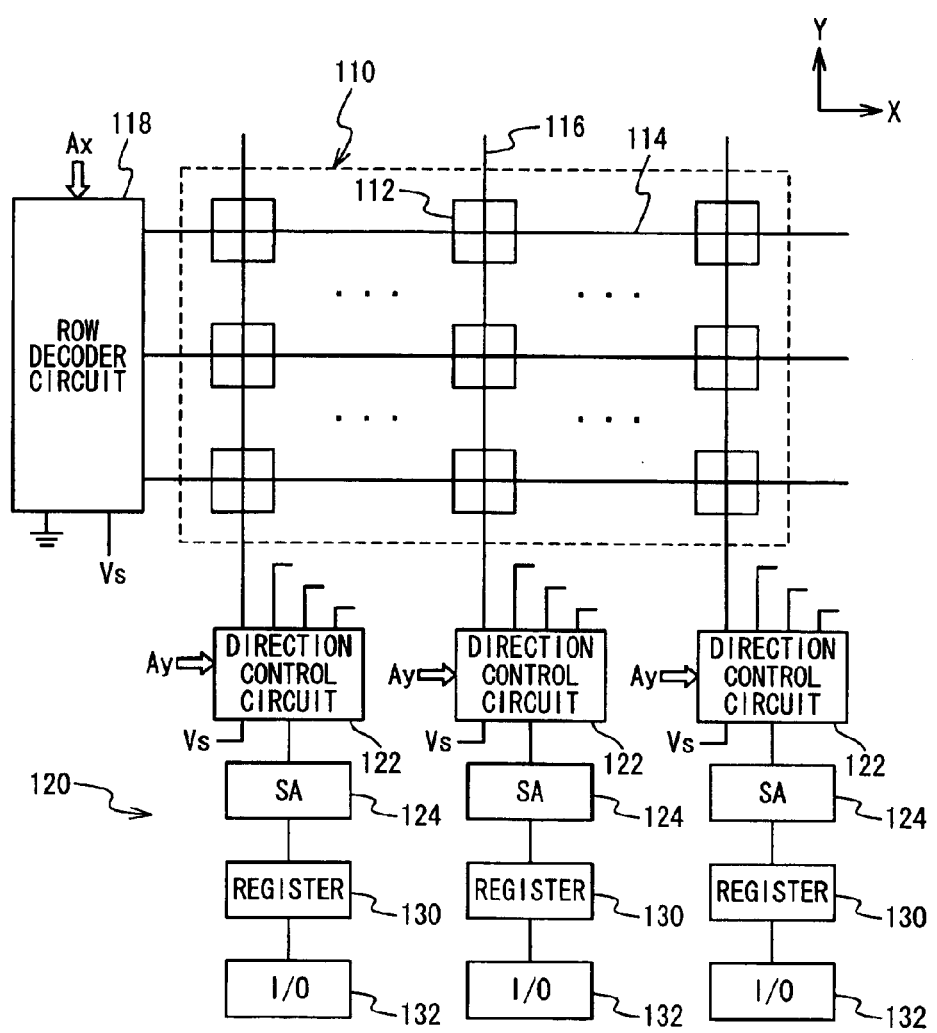
FIG. 1 is a diagram showing a conventional magnetic random access memory.
Figure 2:
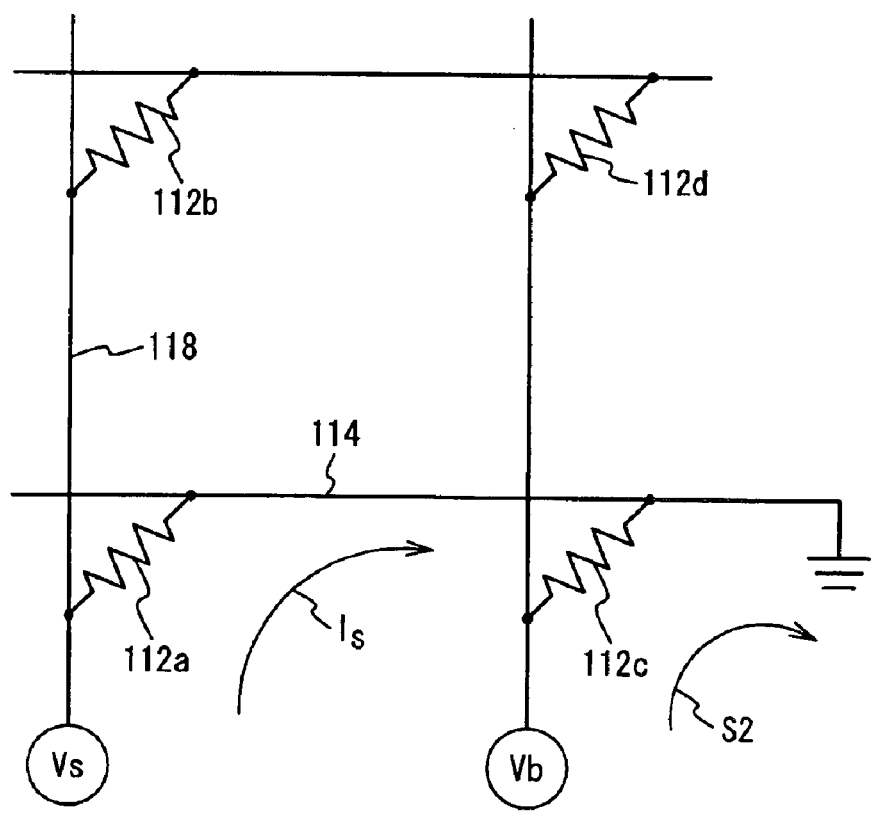
FIG. 2 is a diagram showing an operation of the conventional magnetic random access memory.
Figure 3:
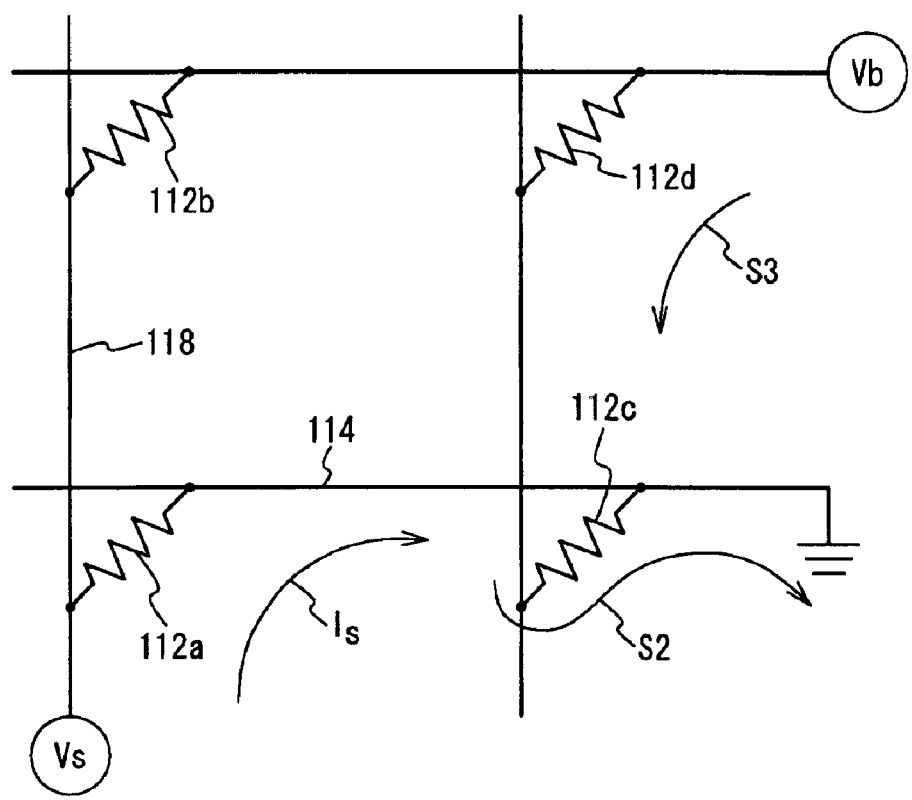
FIG. 3 is a diagram showing another operation of the conventional magnetic random access memory.
Figure 4:
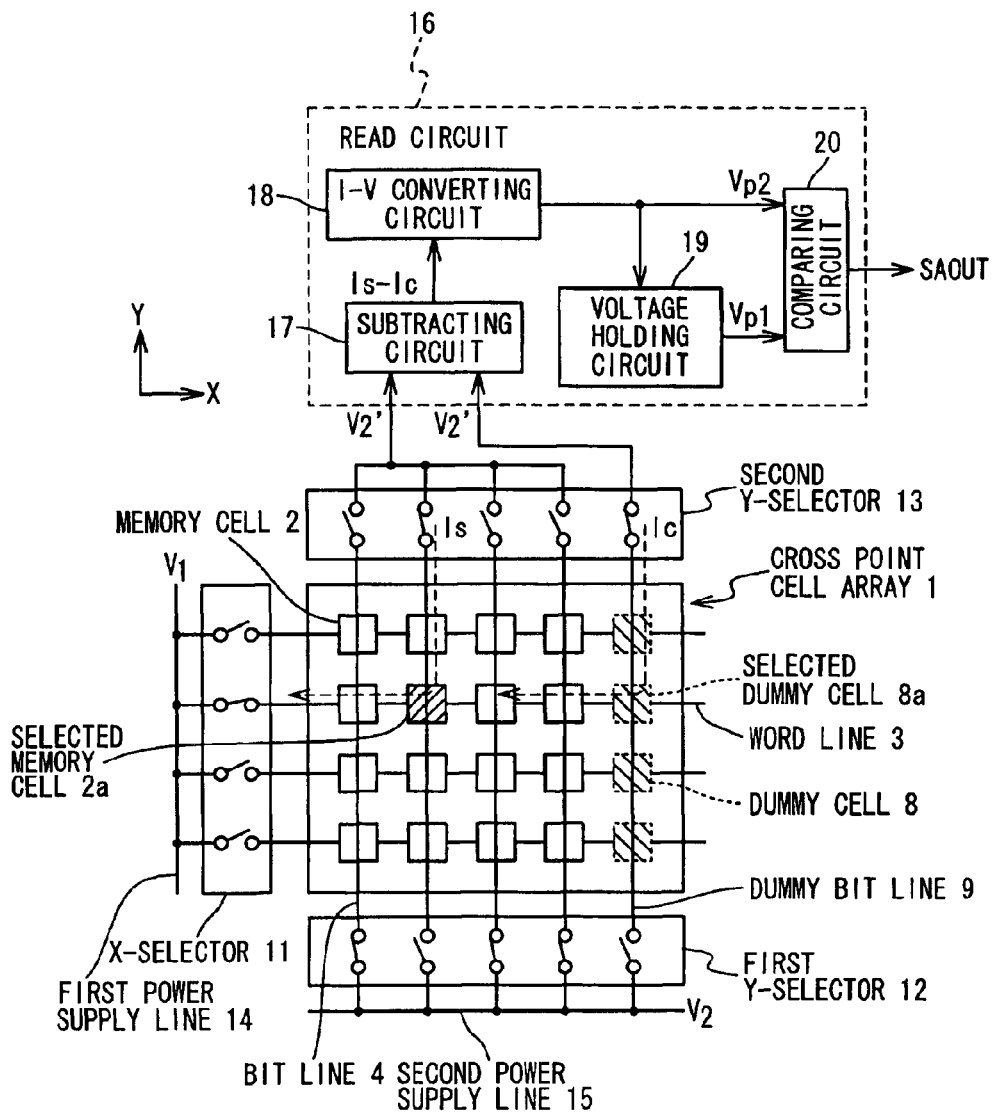
FIG. 4 is a diagram showing a magnetic random access memory according to a first embodiment of the present invention.

The magnetic random access memory according to the first embodiment of the present invention is composed of a cross point cell array 1 as shown in FIG. 4. The cross point cell array 1 contains a plurality of memory cells 2, a plurality of word lines 3 extending into the X-direction (row direction) and a plurality of bit lines 4 extending into a Y-direction (column direction). The memory cell 2 is arranged in the intersection of the word line 3 and the bit line 4.

Figure 5A:
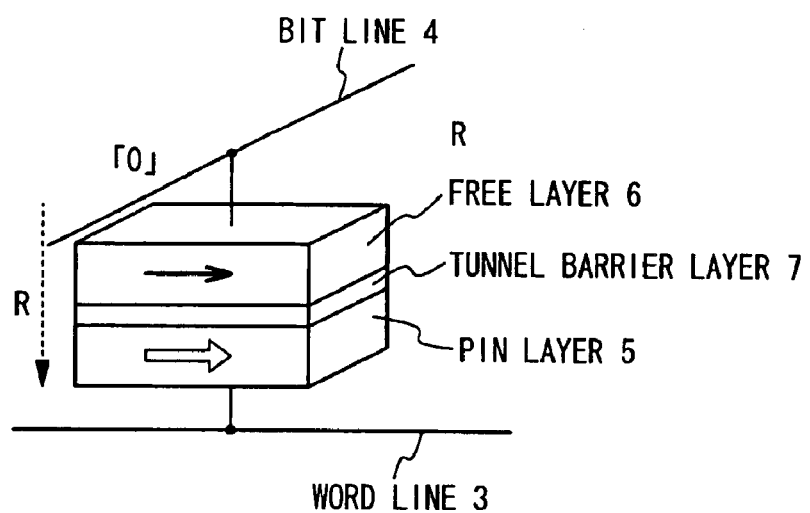
FIGS. 5A and 5B are diagrams showing the structure of a memory cell of the magnetic random access memory in the first embodiment.
Figure 5B:
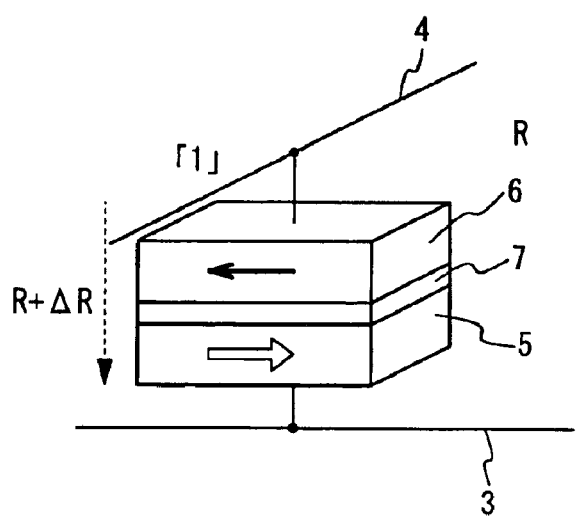

As shown in FIGS. 5A and 5B, each of the memory cells 2 contains a magnetic tunnel junction (MTJ) which is composed of a pin layer 5, a free layer 6 and a tunnel barrier layer 7 interposed between the pin layer 5 and the free layer 6. The pin layer 5 is connected with the word line 3 and the free layer 6 is connected with the bit line 4. The pin layer 5 and the free layer 6 contain ferromagnetic layers with spontaneous magnetization. The spontaneous magnetization of the pin layer 5 is fixed to the X-direction. The spontaneous magnetization of the free layer 6 is invertible and is permitted to direct in parallel or anti-parallel direction to the direction of the spontaneous magnetization of the pin layer 5. The tunnel barrier layer 7 is formed of a thin insulating film for the tunnel electric current to flow through between the pin layer 5 and the free layer 6.

Each of the memory cells 2 stores 1-bit data by the relative direction relation between the direction of the spontaneous magnetization of the pin layer 5 and the direction of the spontaneous magnetization of the free layer 6. The memory cell 2 stores the 1-bit data by setting one of the parallel state and the anti-parallel state to the data of "0" and the other state to "1". Here, the parallel state means that the direction of the spontaneous magnetization of the pin layer 5 and the direction of the spontaneous magnetization of the free layer 6 are same, and the anti-parallel state means that the direction of the spontaneous magnetization of the pin layer 5 and the direction of the spontaneous magnetization of the free layer 6 are opposite.

The resistance of the memory cell 2, that is, the resistance of the magnetic tunnel junction of the memory cell 2 depends on the tunnel magneto-resistance effect (TMR effect) and differs according to the relative direction relation of the spontaneous magnetization of the pin layer 5 and the spontaneous magnetization of the free layer 6. When the direction of the spontaneous magnetization of the pin layer 5 and the direction of the spontaneous magnetization of the free layer 6 are same as shown in FIG. 5A, the resistance of the memory cell 2 is a first value R. When the direction of the spontaneous magnetization of the pin layer 5 and the direction of the spontaneous magnetization of the pin layer 5 of the free layer 6 is opposite as shown in FIG. 5B, the resistance of the memory cell 2 is a second value R+ΔR. An MR ratio ΔR/R is in a range of 10% to 30% in typical magnetic tunnel junction. The data stored in the memory cell 2 can be determined based on the resistance of the memory cell 2.

Moreover, as shown in FIG. 4, the cross point cell array 1 contains dummy cells 8, each of which is located in a position in the Y-direction, and a dummy bit line 9 extending into the Y-direction. The dummy cell 8 is arranged in the intersection of the word line 3 and the dummy bit line 9, to be put between the word line 3 and the dummy bit line 9. The structure of dummy cell 8 is the same as that of the memory cell 2 shown in FIGS. 5A and 5B, except that the free layer 6 is connected with the dummy bit line 9. The dummy cell 8 contains a magnetic tunnel junction which is composed of a fixed pin layer, a fixed free layer and a tunnel barrier layer interposed between them.

Data of either of "1" or "0" is written in the dummy cell 8. It is important that the dummy cell 8 holds the predetermined state, and it is always not necessary that the data is written in the dummy cell. The dummy cell 8 contributes to remove an offset component of the electric current which flows through the memory cell 2, and improves a signal-to-noise ratio at the time of the read operation. The detail of the role of the dummy cell 8 will be described later.

Referring to FIG. 4 again, the cross point cell array 1 contains an X-selector 11, a first Y-selector 12 and a second Y-selector 13 controlled by a control circuit (not shown). The X-selector 11 is connected with the word lines 3 and selects one of the plurality of word lines 3. The first Y-selector 12 and the second Y-selector 13 are connected with the bit lines 4 and selects one of the plurality of bit lines 4. One of the memory cells 2 connected with the selected word line and the selected bit line is a selected memory cell 2a. Moreover, one of the dummy cells 8 connected with the selected word line is a selected dummy cell 8a. The selected dummy cell 8a is used to remove an offset component of the electric current which flows through the selected memory cell 2a, as described later.

Specifically, the X-selector 11 connects the selected word line of the word lines 3 with the first power supply line 14 which has a potential V1 and disconnects the non-selected word lines from the first power supply line 14. The potential V1 is supplied to the selected word line. The non-selected word lines are set to a floating state (high impedance (Hi-Z) state) by the X-selector 11. The first Y-selector 12 connects the non-selected bit lines with the second power supply line 15 which has a potential V2 and disconnects the selected bit line and the dummy bit line 9 from the second power supply line 15. The potential V2 is supplied to the non-selected bit lines. The second Y-selector 13 connects the selected bit line and the dummy bit line 9 with a read circuit 16 and disconnects the non-selected bit lines from the read circuit 16.

The determination of the data stored in the selected memory cell 2a is carried out by the read circuit 16. The read circuit 16 supplies a potential V2' which is substantially the same as the potential V2 of the second power supply line 15, to the selected bit line and the dummy bit line 9 when the data stored in the selected memory cell 2a is to be determined. Through the application of the potential V2' to the selected bit line, the voltage V2'-V1 is applied between the selected bit line and the selected word line, and electric current Is flows through the selected bit line. Moreover, the voltage V2'-V1 is applied between the dummy bit line 9 and the selected word line through the application of the potential V2' to the dummy bit line 9, and electric current Ic flows through the dummy bit line 9. Thus, the potential V2 which is applied to the non-selected bit lines and the potential V2' which is applied to the selected bit line and the dummy bit line 9 are substantively coincided, so that the sneak path electric current which flows through the cross point cell array 1 decreases. The read circuit 16 determines the data stored in the selected memory cell 2a based on the difference Is–Ic between the electric current Is which flows through the selected bit line and the electric current Ic which flows through the dummy bit line 9.

The electric current Is and the electric current Ic are used for the determination of the data stored in the selected memory cell 2a and are the electric currents as described below. The resistance of the selected memory cell 2a changes in accordance with the data stored in the selected memory cell 2a. Therefore, the electric current Is which flows through the selected bit line contains a component corresponding to the data stored in the selected memory cell 2a and changes. The electric current Is which contains the data corresponding component is referred to as a detection electric current Is hereinafter.

The detection electric current Is also contains an offset component which is not an electric current component corresponding to the data stored in the selected memory cell 2a in addition to the data corresponding component. The offset component mainly contains an electric current component generated based on the sneak path electric current and an electric current component based on the resistance component R, which does not depend on the data stored in the selected memory cell 2a, of the two resistance values R and R+ΔR which the selected memory cell 2a can take.

The cross point cell array 1 has many routes through which the sneak path electric current flows. For this reason, the offset component is very larger actually than the data corresponding component. Typically, the offset component is about 30 μA and the electric current component corresponding to the data stored in the selected memory cell 2a is about 1 μA. Therefore, a signal-to-noise ratio of the detection electric current Is itself is not so a large value.

On the other hand, the electric current Ic which flows through the dummy bit line 9 has a magnitude near the offset component contained in the detection electric current Is. The magnitude of the electric current component, depending on the sneak path electric current, of the electric current which flows through some bit line 4 or the dummy bit line 9 mainly depends on the structure of the cross point cell array 1, and there is little dependence to the position of the bit line 4 or the dummy bit line 9. Therefore, the electric current component depending on the sneak path electric current, of the electric current contained in the electric current Ic is almost coincident with the electric current component depending on the sneak path electric current in the electric current contained in the detection electric current Is. Moreover, because the selected dummy cell 8a has the same structure as the selected memory cell 2a, the electric current Ic contains the electric current component to flow based on the resistance component R which does not depend on the direction of the spontaneous magnetization, like the detection electric current Is. Moreover, the electric current Ic contains the dummy cell data corresponding component corresponding to the direction of the spontaneous magnetization of the selected dummy cell 8a. The dummy cell data correspondence component is fixed and so small to extent that it can be ignored, comparing with the offset component. Therefore, the electric current Ic has the magnitude near the offset component contained in the detection electric current Is. Such an electric current Ic is referred to as an offset component electric current Ic hereinafter.

The difference Is–Ic between the detection electric current Is and the offset component electric current Ic is near the value obtained by subtracting an offset component from the detection electric current Is, i.e., is almost coincident with the data corresponding component of the data stored in the selected memory cell 2a. Therefore, the signal-to-noise ratio of the difference Is–Ic is large. It is made possible to determine the data stored in the selected memory cell based on large difference Is–Ic with the large signal-to-noise ratio in reliability. Moreover, because the component depending on the sneak path electric current is removed as the previously mentioned offset component, the component depending on the sneak path electric current is removed from the electric current Is–Ic. In this way, it is possible to determine the data while an influence of the sneak path electric current is restrained, by determining the data stored in the selected memory cell 2a based on the electric current Is–Ic.

The read circuit 16 is generally realized from a subtracting circuit 17, an I-V converting circuit 18, a voltage holding circuit 19 and a comparing circuit 20. The subtracting circuit 17 is connected with the selected bit line and the dummy bit line 9 through the second Y-selector 13. The subtracting circuit 17 generates the electric current Is–Ic by subtracting the offset component electric current Ic which flows through the dummy bit line 9 from the detection electric current Is which flows through the selected bit line.

Figure 6:
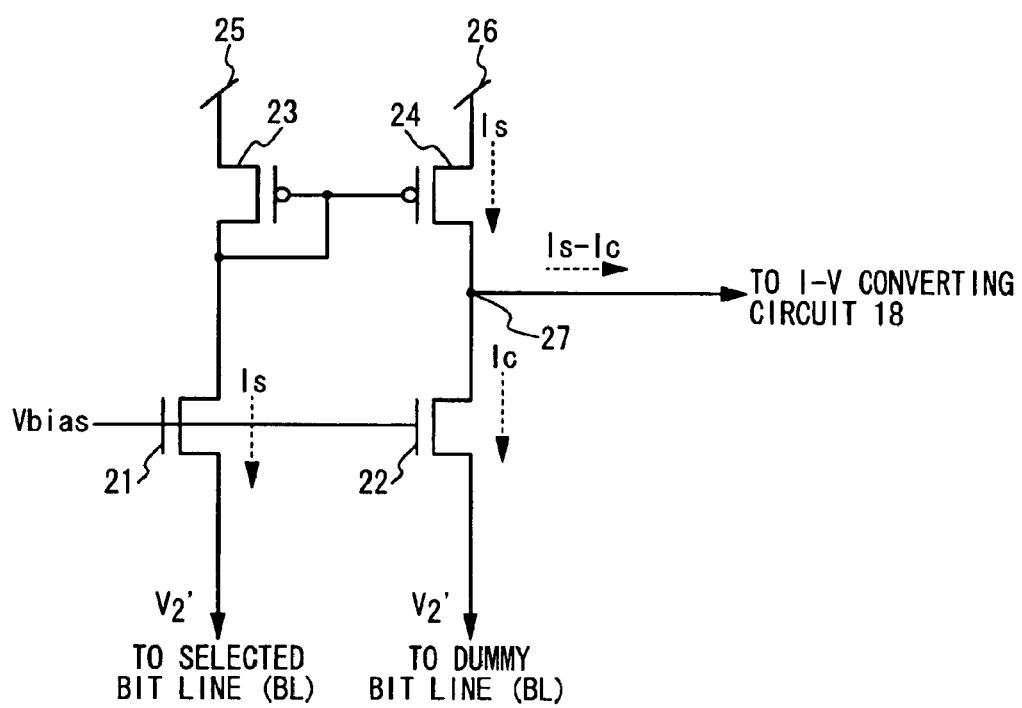
FIG. 6 is a circuit diagram showing a subtraction circuit.

FIG. 6 shows a typical subtracting circuit 17. The subtracting circuit 17 contains NMOS transistors. 21 and 22, and PMOS transistors 23 and 24. The source of NMOS transistor 21 is connected with the selected bit line and the source of NMOS transistor 22 is connected with the dummy bit line 9. The potential Vbias is supplied to the gate of NMOS transistors 21 and 22. By controlling the potential Vbias appropriately, the potentials of the sources of NMOS transistors 21 and 22 are held to the potential V2'. Therefore, the selected bit line and the dummy bit line 9 are held to the potential V2'. The drain of NMOS transistor 21 is connected with the drain of PMOS transistor 23 and the drain of NMOS transistor 22 is connected with the drain of PMOS transistor 24. The sources of PMOS transistors 23 and 24 are connected respectively with the power supply terminals 25 and 26 which have power supply potential $V_{cc}$. The drain of PMOS transistor 23 is connected with the gates of PMOS transistors 23 and 24. An output node 27 is provided for the signal line which links the drain of PMOS transistor 24 and the drain of NMOS transistor 22, and the output node 27 is connected with an I-V converting circuit 18.

When the detection electric current Is flows through the selected bit line via the NMOS transistor 21 and the PMOS transistor 23 from the power supply terminal 25 of the subtracting circuit 17, the electric current with the same magnitude as the detection electric current Is flows through the PMOS transistor 23 from the power supply terminal 26, and the electric current with the same magnitude as the detection electric current Is flows out to the output node 27. On the other hand, the offset component electric current Ic which flows through the dummy bit line 9 via the NMOS transistor 22 is drawn out from the output node 27 and the electric current Is–Ic corresponding to the difference between the detection electric current Is and the offset component electric current Ic is supplied to the I-V converting circuit 18 through output node 27.

The I-V converting circuit 18 is an electric current-voltage amplifier for converting the electric current Is–Ic outputted from the subtracting circuit 17 into a voltage. The voltage outputted from the I-V converting circuit 18 changes in accordance with the resistance of the selected memory cell 2a, i.e. the stored data stored in the selected memory cell 2a.

As described above, the electric current Is–Ic corresponds to the electric current obtained by removing the offset component from the detection electric current Is. The removal of the offset component from the detection electric current Is can increase the gain of I-V converting circuit 18. Because there is limitation in the maximum voltage outputted from the I-V converting circuit 18, the gain of I-V converting circuit 18 is limited to a relatively small value in case that the detection electric current Is is converted into the voltage without removing the offset current component. This means that the change width of the voltage outputted from the I-V converting circuit 18 cannot be increased in correspondence to the data stored in the selected memory cell 2a. By removing the offset component from the detection electric current Is, it is possible for the gain of the I-V converting circuit 18 to be increased. Therefore, the change width of the voltage outputted from the I-V converting circuit 18 can be made large in correspondence to the data stored in the selected memory cell 2a.

The output of the I-V converting circuit 18 is connected with the inputs of the voltage holding circuit 19 and comparing circuit 20. The voltage holding circuit 19 has a function to hold the voltage outputted from the I-V converting circuit 18 and a function to output the held voltage. The voltage holding circuit 19 contains a sufficiently large capacitor device (not illustrated), and holds the voltage outputted from the I-V converting circuit 18 by the capacity device. The comparing circuit 20 is connected with the output of the I-V converting circuit 18 and the output of the voltage holding circuit 19. The comparing circuit 20 determines the data stored in the selected memory cell 2a by comparing the voltage outputted from the I-V converting circuit 18 and the voltage outputted from the voltage holding circuit 19. The large change of the voltage outputted from the I-V converting circuit 18 based on the data stored in the selected memory cell 2a improves the reliability to determine the stored data. The comparing circuit 20 generates a data signal SAOUT corresponding to the data stored in the selected memory cell 2a.

Figure 7:
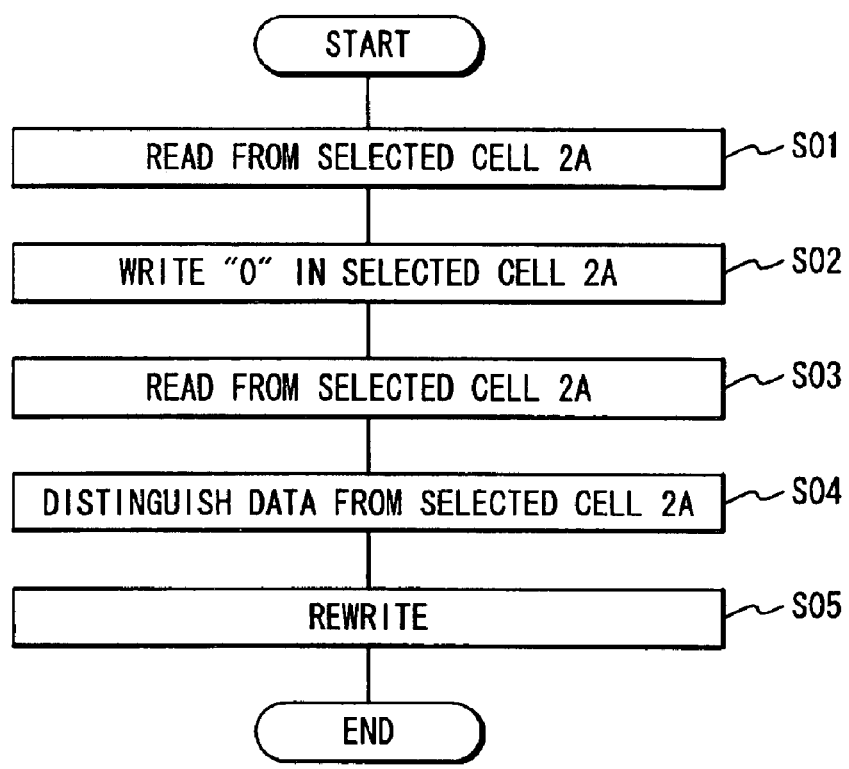
FIG. 7 is a flow chart showing a read operation of the magnetic random access memory in the first embodiment.

A self reference system is used for the read operation of the magnetic random access memory in the first embodiment. FIG. 7 is a flow chart showing the read operation of the magnetic random access memory in the first embodiment.

(Step S01)

The read operation to the selected memory cell 2a is carried out. The read operation is carried out by the following process.

One of the word lines is selected by the X-selector 11 and one of the bit lines is selected by the first Y-selector 12 and the second Y-selector 13. Next, the potential V1 is supplied to the selected word line and the potential V2' is supplied to the selected bit line and the dummy bit line 9. By this, the voltage V2'-V1 is applied to the selected memory cell 2a and the selected dummy cell 8a, and the detection electric current Is flows though the selected bit line and the offset component electric current Ic flows through the dummy bit line 9. The electric current Is–Ic is generated by the subtracting circuit 17 by removing the offset component electric current Ic from the detection electric current Is and the electric current Is–Ic is converted into the voltage by the I-V converting circuit 18 to generate the first read voltage Vp1 corresponding to electric current Is–Ic. The first read voltage Vp1 has the magnitude corresponding to the data stored in the selected memory cell 2a. The first read voltage Vp1 is supplied to the voltage holding circuit 19, and the first read voltage Vp1 is taken and held therein by the voltage holding circuit 19. After taking in the first read voltage Vp1, the voltage holding circuit 19 is disconnected from the I-V converting circuit 18.

(Step S02)

The data "0" is written in the selected memory cell 2a. A write electric current is supplied to the selected word line and the selected bit line and the direction of the spontaneous magnetization of the selected memory cell 2a is turned to set the selected memory cell 2a to the state corresponding to "0" with the magnetic field generated by the write electric current.

(Step S03)

The read operation to the selected memory cell 2a is carried out once again. Like the step S01, the detection electric current Is flows though the selected bit line and the offset component electric current Ic flows through the dummy bit line 9. The electric current Is–Ic is converted into the voltage by the I-V converting circuit 18 and the second read voltage Vp2 corresponding to the electric current Is–Ic is generated. The second read voltage Vp2 has the magnitude corresponding to the data "0" stored in the selected memory cell 2a. The second read voltage Vp2 is used as the reference voltage to be described later.

(Step S04)

The determination of the data stored in the selected memory cell 2a, that is, the data which has been written before the data of "0" is written in the selected memory cell 2a is carried out by the comparing circuit 20 and the data signal SAOUT showing the stored data is generated. The determination of the stored data is carried out as follows.

The first read voltage Vp1 held by the voltage holding circuit 19, and the second read voltage Vp2 generated by the I-V converting circuit 18 are supplied to the comparing circuit 20 and the comparing circuit 20 is activated. When the comparing circuit 20 is activated, the comparing circuit 20 determines the data which is written in the selected memory cell 2a by comparing the first read voltage Vp1 and second read voltage Vp2. When the first read voltage Vp1 and the second read voltage Vp2 are almost coincident with each other, the stored data stored in the selected memory cell 2a is determined as "0", and the data signal SAOUT of "0" is outputted from the comparing circuit 20. When the first read voltage Vp1 and second read voltage Vp2 are largely different from each other, the stored data stored in the selected memory cell 2a is determined as "1", and the data signal SAOUT of "1" is outputted from the comparing circuit 20.

(Step S05)

When the data stored in the selected memory cell 2a is determined to be "1" at step S04, the rewrite operation is carried out to write the data of "1" in the selected memory cell 2a again. As described above, because the data of "0" is written in the selected memory cell 2a in the process of the determination of the stored data, the selected memory cell 2a are returned to the state holding the right data through the rewrite operation. By the rewrite operation, the read operation of the magnetic random access memory in the first embodiment completes.

As described above, in the magnetic random access memory in the first embodiment, the offset component electric current Ic is generated using the dummy cell 8. Moreover, the electric current Is–Ic corresponding to the difference between the detection electric current Is which flows through the selected bit line and the offset component electric current Ic is generated, and the determination of the data stored in the selected memory cell 2a is carried out based on the electric current Is–Ic. The electric current Is–Ic corresponds to the electric current obtained by removing the offset component from the detection electric current Is and the signal-to-noise ratio of electric current Is–Ic is large. Thus, it improves the reliability of the determination of the data that the determination of the data is carried out based on the electric current Is–Ic with the large signal-to-noise ratio.

Because the component depending on the sneak path electric current is contained in the removed offset component, the component depending on the sneak path electric current is removed from electric current Is–Ic. Therefore, the influence of the sneak path electric current to the determination of the stored data can be effectively restrained by determining the data stored in the selected memory cell 2a based on the electric current Is–Ic.

Moreover, the removal of the offset component from the detection electric current Is makes it possible to increase the gain of the I-V converting circuit 18. The increase in the gain of the I-V converting circuit 18 increases the change width of the first read voltage Vp1 generated by the I-V converting circuit 18 and corresponding to the data stored in the selected memory cell 2a and improves the reliability of the determination of the data more effectively.

The determination of the data stored in the selected memory cell 2a based on the electric current Is–Ic is desirable in the point that admissibility to manufacturing variation of the cross point cell array 1 is made high. When many magnetic random access memories in this embodiment are manufactured, the offset component contained in the detection electric current Is is different for every magnetic random access memory depending on the manufacturing variations of the cross point cell array 1. However, in the single magnetic random access memory, the change of the offset component is common in the detection electric current Is and the offset component electric current Ic. Therefore, the manufacturing variations of the cross point cell array 1 are difficult to be reflected on the electric current Is–Ic and for electric current Is–Ic to be stabilized. The determination of the data stored in the selected memory cell 2a based on the stabilized electric current Is–Ic improves in the reliability of the determination of the stored data. The magnetic random access memory in this embodiment has the high admissibility to manufacturing variation of the cross point cell array 1.

Moreover, in the above-mentioned magnetic random access memory, it is possible to decrease the number of the memory cells from which data cannot be read because of the existence of short-circuited memory cell when the memory cell having a short-circuit (hereinafter, to be referred to as "the short-circuited cell") exists. As shown in FIG. 8A, when the short-circuited cell 28' exists in the memory cell array of a conventional magnetic random access memory, it is impossible to read data from the memory cells connected with the same word line as that of connected with the short-circuited cell 28' and the memory cells connected with the same bit line as that the short-circuited cell 28'. When the short-circuited cell 28' exists, the sneak path electric current which flows through the short-circuited cell 28' becomes large remarkably. The electric current which exceeds the input range of the circuit to determine the data flows due to the sneak path electric current. For this reason, the function of the circuit to determine the data is lost.

Figure 8B:
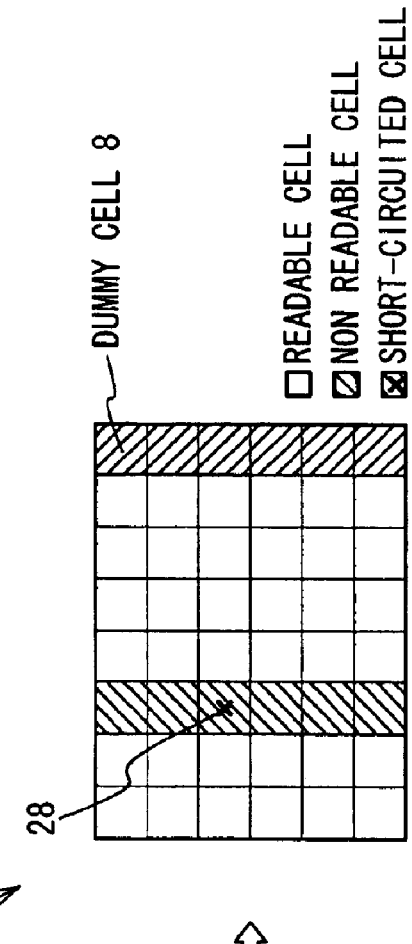
FIG. 8B is a diagram showing memory cells from which data cannot be read in the magnetic random access memory in the first embodiment.
Figure 8A:
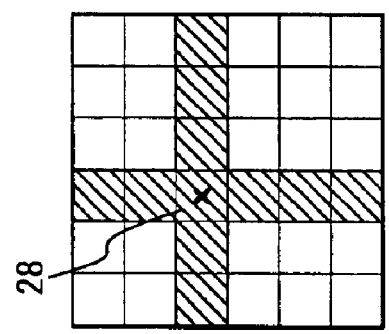
FIG. 8A is a diagram showing memory cells from which data cannot be read in a conventional magnetic random access memory.

As shown in FIG. 8B, in the magnetic random access memory in this embodiment, even if the short-circuited cell 28 exists in the cross point cell array 1, it is possible to read data from the memory cell 2 connected with the word line with which the short-circuited cell 28 is connected. However, it is impossible to read data from the memory cell 2 connected with the bit line with which the short-circuited cell 28 is connected. This is because the detection electric current Is and the offset component electric current Ic commonly contain the offset component which increases due to the existence of short-circuited cell 28, and the offset component can be removed by the subtracting circuit 17. In the magnetic random access memory of this embodiment, the memory cells from which data can be read due to the existence of short-circuited cell 28 are only the memory cells connected with the bit line with which the short-circuited cell 28 is connected. Thus, the number of the memory cells from which data cannot be read decreases.

In this way, the redundant design can be made easy so that data can be read from the memory cells connected with the word line with which the short-circuited cell 28 is connected. In the magnetic random access memory of this embodiment, when the short-circuited cell 28 exists, it is possible to relieve a fault column by substituting the fault column containing the short-circuited cell 28 by a redundant column.

Figure 9:
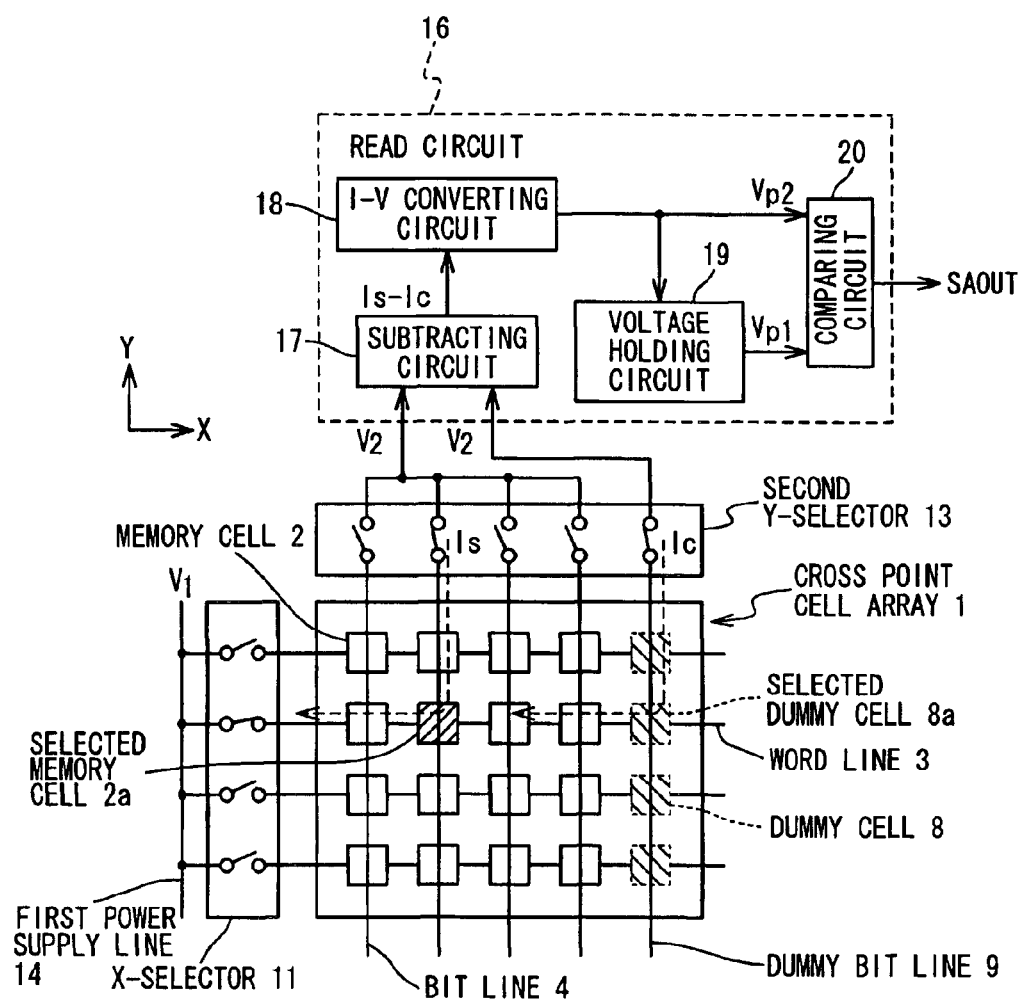
FIG. 9 is a diagram showing a modification example of the magnetic random access memory according to the first embodiment of the present invention.

As shown in FIG. 9, in the first embodiment, it is possible to remove the first Y-selector 12 and the second power supply line 15 from the magnetic random access memory shown in FIG. 4. In this case, the non-selected bit lines are not fixed on the potential V2 and is made to set to a floating state. It is desirable from the viewpoint of the reduction of the chip area for the magnetic random access memory that the first Y-selector 12 and the second power supply line 15 can be removed.

On the other than, when the first Y-selector 12 and the second power supply line 15 are removed, the sneak path electric current increases which flows through the cross point cell 1. However, the increase of the sneak path electric current is permissible. As described above, the non-selected bit lines are set to the floating state when the first Y-selector 12 and the second power supply line 15 are removed. As a result, the sneak path electric current increases. However, in the magnetic random access memory of the first embodiment, the data of the selected memory cell 2a is detected based on the difference between the detection electric current Is and the offset component electric current Ic. Therefore, the influence of the sneak path electric current to the read operation is small. Thus, the read operation is never prevented for the reason of the increase of the sneak path electric current.

(Second Embodiment)

Figure 10:
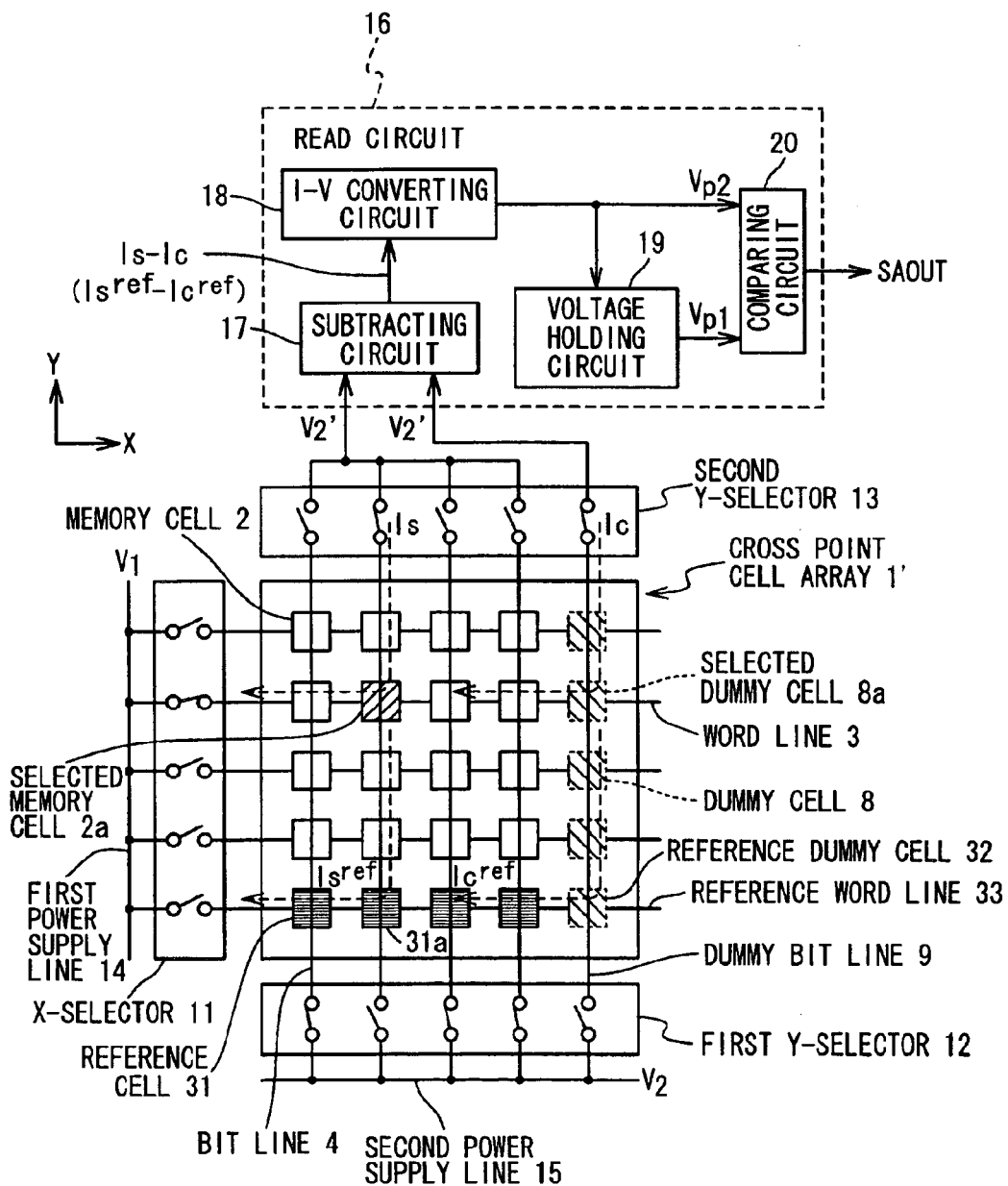
FIG. 10 is a diagram showing the magnetic random access memory according to a second embodiment of the present invention.

FIG. 10 shows the magnetic random access memory of the second embodiment. In the second embodiment, the cross point cell array 1 of FIG. 4 is added with reference cells 31 and a reference dummy cell 32 which are arranged in line in the X-direction (the direction of the word line), and a reference word line 33 extending into the X-direction (the direction of the word line). Such a cross point cell array 1 is hereinafter referred to as a cross point cell array 1'.

The reference cells 31 and the reference dummy cell 32 have the same structure as either of the memory cells 2. Each of the reference cells 31 and the reference dummy cell 32 contains a magnetic tunnel junction which is composed of a pin layer, a free layer, and a tunnel barrier layer interposed between the pin layer and the free layer.

A predetermined data such as "0" is stored in the reference cell 31 which is used for the determination of the data in case of a read operation. However, the role of reference cell 31 is different from the role of the dummy cell 8. As described above, the dummy cell 8 is used for the generation of the offset component electric current Ic that is used to remove the offset component from the detection electric current Is. On the other hand, the reference cell 31 is used for the generation of the reference voltage. By comparing the reference voltage generated using the reference cell 31 and the read voltage generated in accordance with the data stored in the memory cell 2, the stored data is determined. It should be noted that in the Specification of the present invention, the "reference cell" and the "dummy cell" are used from the difference of the role to have different meanings.

The reference cells 31 are provided for the number of bit lines 4. The reference cell 31 is arranged in the position where the bit line 4 and the reference word line 33 intersect, and each of the reference cells 31 is interposed between the bit line 4 and the reference word line 33. On the other hand, the reference dummy cell 32 is arranged in the position where the reference word line 33 and the dummy bit line 9 intersect, and is interposed between the reference word line 33 and the dummy bit line 9. The reference word line 33 is connected with the X-selector 11.

Figure 11:
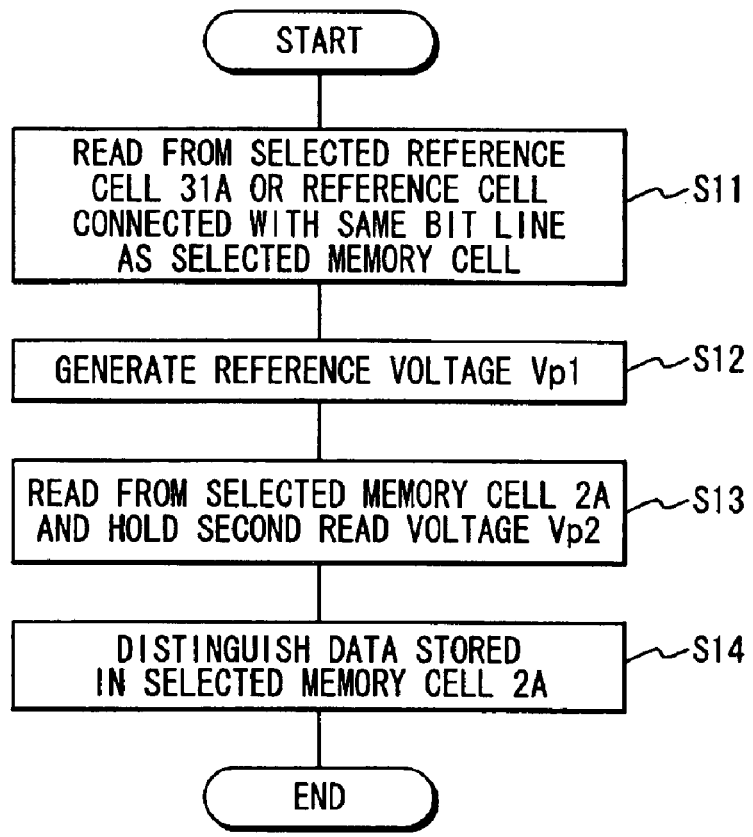
FIG. 11 is a flow chart showing a read operation of the magnetic random access memory in the second embodiment.

FIG. 11 is a flow chart showing a read operation of the magnetic random access memory in the second embodiment.

(Step S11)

One 31a of the reference cells 31 which is connected to the same selected bit line as the selected memory cell 2a is selected, and data is read out from the selected reference cell 31a. The read operation of the data from the selected reference cell 31a is carried out in accordance with the following process.

The selected bit line and the dummy bit line 9 are connected with the read circuit 16 by the second Y-selector 13 and the non-selected bit lines are connected with the second power supply line 15 by the first Y-selector 12. Thus, the potential V2 is supplied to the non-selected bit lines and the potential V2' which is substantially same as the potential V2 is supplied to the selected bit line and the dummy bit line 9. The selected bit line and the dummy bit line 9 are electrically separated from the non-selected bit lines.

Figure 12A:
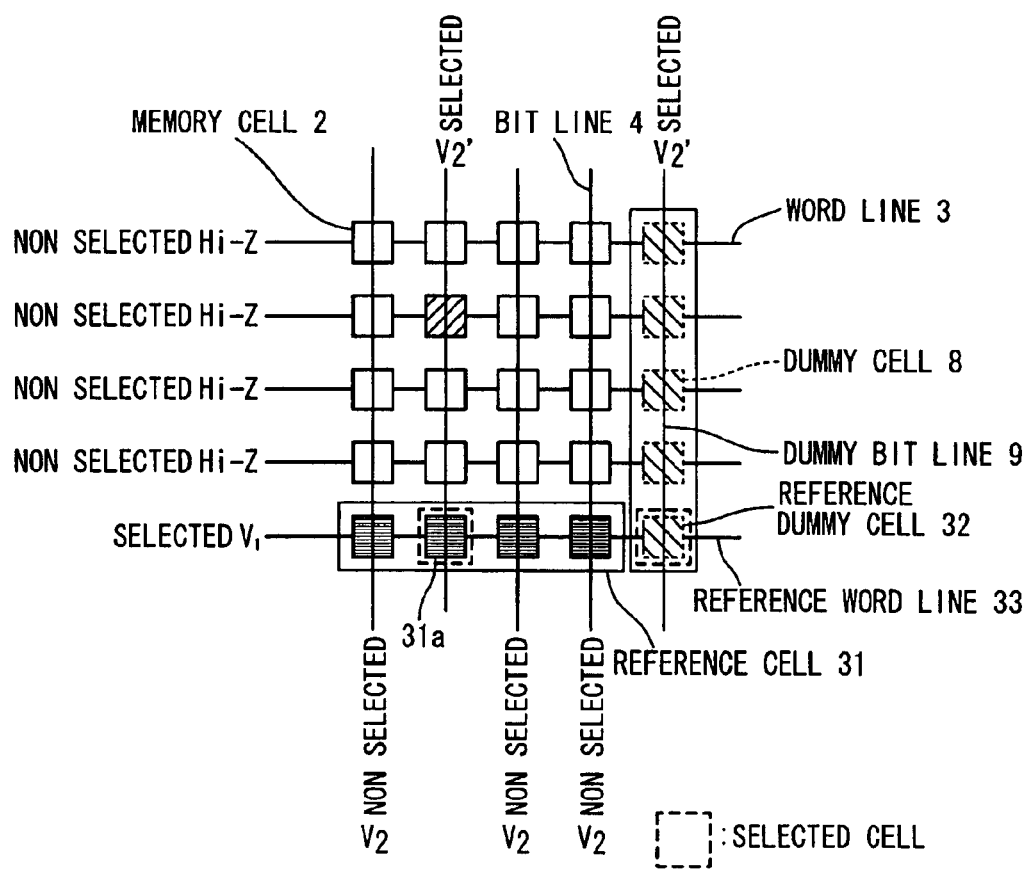
FIG. 12A is a diagram showing a voltage applied to each word line (reference word line) and a voltage applied to each bit line (dummy bit line) when a selected reference cell is read-accessed.

Moreover, the reference word line 33 is connected with the first power supply line 14 by the X-selector 11, and the potential V1 is supplied to the reference word line 33, as shown in FIG. 12A. The word line 4 is separated from the first power supply line 14 and is made set to a floating state (the Hi-Z state).

By supplying the potential V2' and the potential V1, the voltage V2'-V1 is applied to the selected reference cell 31a and the reference dummy cell 32. As shown in FIG. 10, through the application of the voltage V2'-V1, an electric current Isref flows through the selected bit line and an electric current Icref flows through the dummy bit line 9. The argument of the electric current Is and electric current Ic in the first embodiment is applied to the electric current Isref and the electric current Icref in the second embodiment. The electric current Isref contains a data dependent component which depends on the state of the spontaneous magnetization of the selected reference cell 31a, i.e., the data stored in the selected reference cell 31a, and the electric current Isref is referred to as a reference detection electric current Isref below. The electric current Icref has the magnitude equivalent to the offset component which does not depend on the data stored in the selected reference cell 31a of the reference detection electric currents Isref, and is referred to as an offset component electric current Icref below.

By removing or subtracting the offset component electric current Icref from the detection electric current Isref by the subtracting circuit 17, the electric current Isref-Icref is generated, and the electric current Isref-Icref is converted into a voltage by the I-V converting circuit 18. Thus, a first read voltage Vp1 corresponding to the electric current Isref-Icref is generated. The first read voltage Vp1 is used as a reference voltage to determine the data stored in the selected memory cell 2a, as described later. Therefore, the first read voltage Vp1 is referred to as a reference voltage Vp1 hereinafter.

(Step S12)

The reference voltage Vp1 is supplied to the voltage holding circuit 19. The reference voltage Vp1 is taken and held therein by the voltage holding circuit 19. After taking in the reference voltage Vp1, the voltage holding circuit 19 is disconnected from the I-V converting circuit 18.

(Step S13)

Figure 12B:
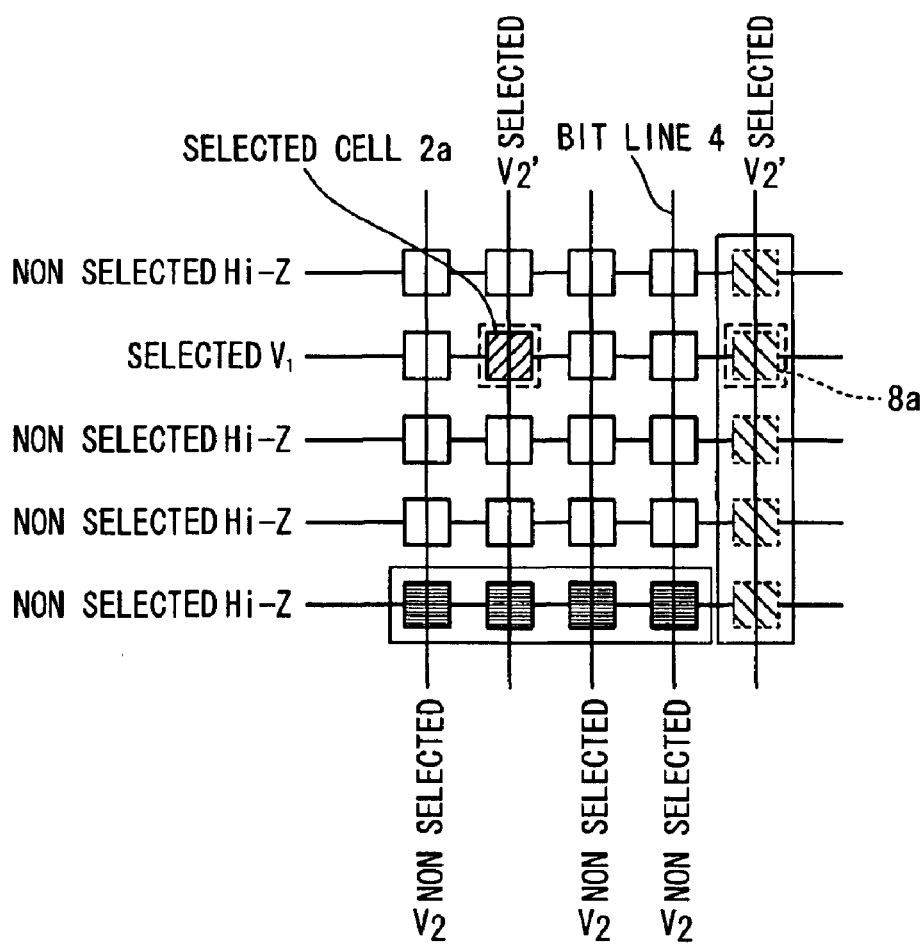
FIG. 12B is a diagram showing a voltage applied to each word line (reference word line) and a voltage applied to each bit line (dummy bit line) when a selected cell is read-accessed.

A read operation from the selected memory cell 2a is carried out in the following process. One of the word lines is selected by the X-selector 11 and one of the bit lines is selected by the first Y-selector 12 and the second Y-selector 13. As shown in FIG. 12B, the potential V1 is supplied to the selected word line and the potential V2' is supplied to the selected bit line and the dummy bit line 9. Thus, the voltage V2'-V1 is applied to the selected memory cell 2a and the selected dummy cell 8a, and the detection electric current Is flows through the selected bit line and the offset component electric current Ic flows through the dummy bit line 9 as shown in FIG. 10. The electric current Is–Ic is generated by subtracting the offset component electric current Ic from the detection electric current Is by the subtracting circuit 17, and the electric current Is–Ic is converted into the voltage by the I-V converting circuit 18. Thus, a second read voltage Vp2 corresponding to the electric current Is–Ic is generated.

The I-V converting circuit 18 changes the gain between a case of generating the second read voltage Vp2 and a case of generating the reference voltage Vp1 (the first read voltage Vp1). The change of the gain is carried out to meet the following equation:

$$V_{p2}(0) < V_{p1} < V_{p2}(1) \qquad (1)$$

where $V_{p2}(0)$ is the second read voltage $V_{p2}$ outputted from the I-V converting circuit 18 when "0" is stored in the selected memory cell 2a, $V_{p2}(1)$ is the second read voltage $V_{p2}$ outputted from the I-V converting circuit 18 when "1" is stored in the selected memory cell 2a.

(Step S14)

The data stored in the selected memory cell 2a is determined by the comparing circuit 20 and a data signal SAOUT showing the stored data is generated. The determination of the stored data is carried out as follows. The reference voltage $V_{p1}$ held by the voltage holding circuit 19, and the second read voltage $V_{p2}$ generated by the I-V converting circuit 18 are supplied to the comparing circuit 20 and the comparing circuit 20 is activated. When the comparing circuit 20 is activated, the comparing circuit 20 determines the data stored in the selected memory cell 2a by comparing the reference voltage $V_{p1}$ and the second read voltage $V_{p2}$. When the reference voltage $V_{p1}$ is equal to or larger than the second read voltage $V_{p2}$, the comparing circuit 20 determines the data stored in the selected memory cell 2a to be "0", and outputs the data signal SAOUT of "0". When the reference voltage $V_{p1}$ is smaller than the second read voltage $V_{p2}$, the comparing circuit 20 determines the data stored in the selected memory cell 2a to be "1", and the comparing circuit 20 outputs the data signal SAOUT of "1". Through the generation of data signal SAOUT, the read operation of the magnetic random access memory in the second embodiment completes.

As described above, the magnetic random access memory in the second embodiment has the same advantages as the magnetic random access memory in the first embodiment. By determining the data stored in the selected memory cell 2a based on the electric current Is–Ic, a signal-to-noise ratio is increased and the influence of the sneak path electric current to the determination of the stored data is restrained. Moreover, by determining the data stored in the selected memory cell 2a based on the electric current Is–Ic, an admissibility to manufacturing variations of the cross point cell array 1 is improved. Moreover, in the magnetic random access memory of the second embodiment, when a fault memory cell having a short-circuit exists, the read operation to the memory cells which are connected with the same word line with as the fault memory cell is possible. The number of the memory cells from which data cannot be read because of the existence of the fault memory cell decreases.

Moreover, the magnetic random access memory in the second embodiment has another advantage as described below. First, the reference cell 31 is used for the determination of the data stored in the selected memory cell 2a. It is possible to adopt the read operation in which a self reference method is not used. It is desirable from the viewpoint that the nondestructive readout of the data stored in the memory cell 2 is made possible.

Second, the selected reference cell 31a which is connected with the same bit line with as the selected memory cell 2a is used for the determination of the data stored in the selected memory cell 2a. Therefore, the reliability of the determination of the stored data can be further improved.

As described above, in the second embodiment, the non-selected word lines are made to set to a floating state (the Hi-Z state). The sneak path electric current increase which flows through the non-selected memory cells which is connected with the selected bit line by setting the non-selected word lines to the floating state. The magnitude of the sneak path electric current changes in accordance with the data stored in each of the non-selected memory cells which are connected with the selected bit line. More specifically, the magnitude of the sneak path electric current changes in accordance with the ratio of the number of the memory cells which store "0" and the number of the memory cells which store "1", of the non-selected memory cells connected with the selected bit line.

Influence of the change of the magnitude of the sneak path electric current which flows through the non-selected memory cells which are connected with the selected bit line is canceled by using the selected reference cell 31a which is connected with the selected bit line with which the selected memory cell 2a is connected, for the determination of the data stored in the selected memory cell 2a. The influence of the sneak path electric current on the reference detection electric current Isref which flows through the selected bit line when the read operation is carried out to the selected reference cell 31a is substantially same as the influence of the sneak path electric current on the reference detection electric current Is which flows through the selected bit line when the read operation is carried out to the selected memory cell 2a. Therefore, the influence of the change of the sneak path electric current can be canceled and the degradation of the reliability of the determination of the data stored in the selected memory cell 2a does not occur.

In the above-mentioned second embodiment, the read operation is carried out to the selected reference cell 31a, and then the read operation is carried out to the selected memory cell 2a. However, the read operation may be carried out to the selected memory cell 2a, and then the read operation may be carried out to the selected reference cell 31a. In this case, the second read voltage $V_{p2}$ generated from the electric current Is–Ic is held by the voltage holding circuit 19. Moreover, the reference voltage Vp1 is generated from the electric current Isref-Icref, and the second read voltage Vp2 held by the voltage holding circuit 19 and the reference voltage Vp1 are compared and the data signal SAOUT is generated.

Figure 13:
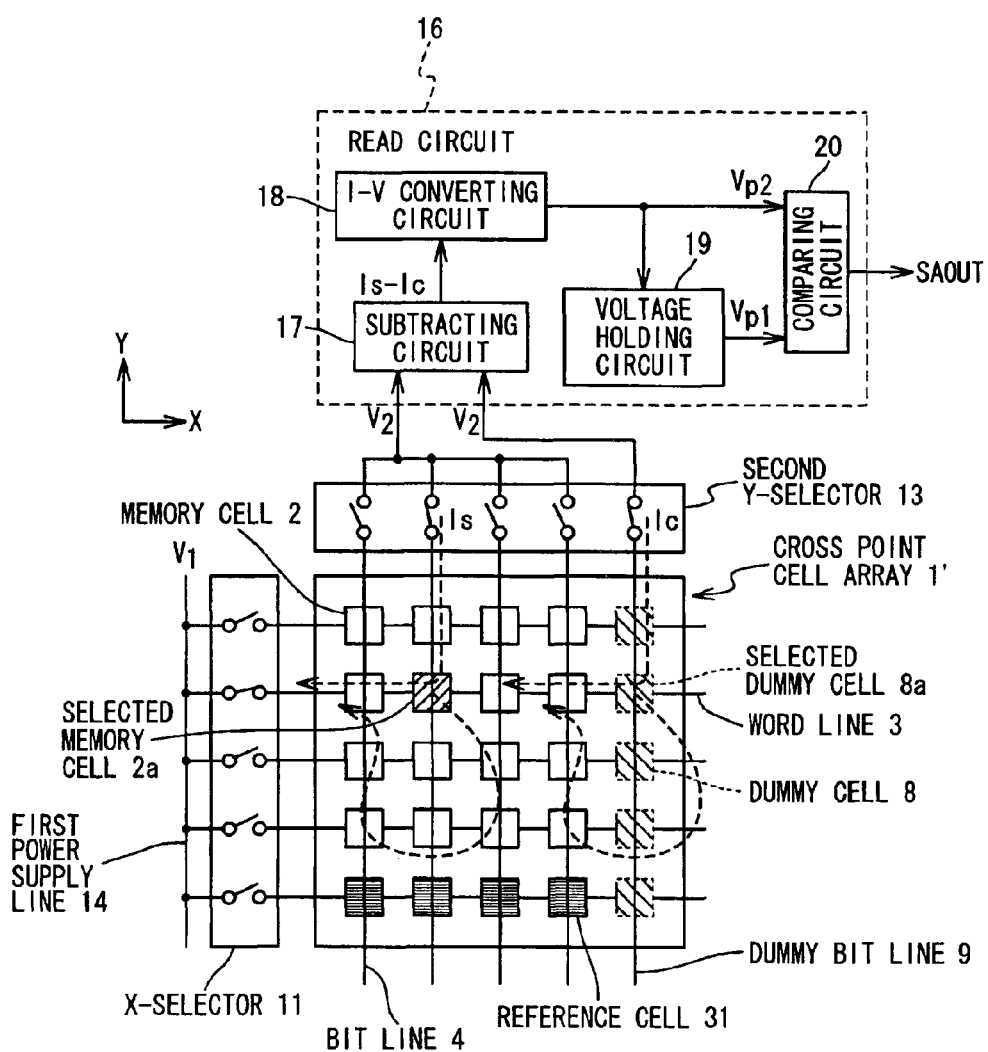
FIG. 13 is a diagram showing a modification example of the magnetic random access memory according to the second embodiment of the present invention.

Also, in the second embodiment, the first Y-selector 12 and the second power supply line 15 may be removed from the magnetic random access memory shown in FIG. 10, as shown in FIG. 13. In this case, the non-selected bit lines are not fixed on the potential V2 and is made to be set to a floating state. It is desirable from the viewpoint of the reduction of the chip area for the magnetic random access memory that the first Y-selector 12 and the second power supply line 15 are removed. As described in the first embodiment, the influence of the increase of the sneak path electric current because of setting the non-selected bit lines to the floating state is effectively canceled by subtracting the offset component from the detection electric current Is.

(Third Embodiment)

As descried above, in the magnetic random access memories shown in FIGS. 4, 9, 10 and 13, it is impossible to read data from the memory cell 2 which is connected with the same bit line as a short-circuited cell when the short-circuited cell exists in the cross point cell array 1 (or 1'). However, the existence of the short-circuited cell does not have any influence on the read operation of the memory cell 2 which is connected with the same word line as the short-circuited cell. Such a characteristic makes the redundant design easy in which the fault cell column containing the short-circuited cell is substituted by a redundant cell column of redundant memory cells. The redundant design is adopted for the magnetic random access memory in the third embodiment.

Figure 14:
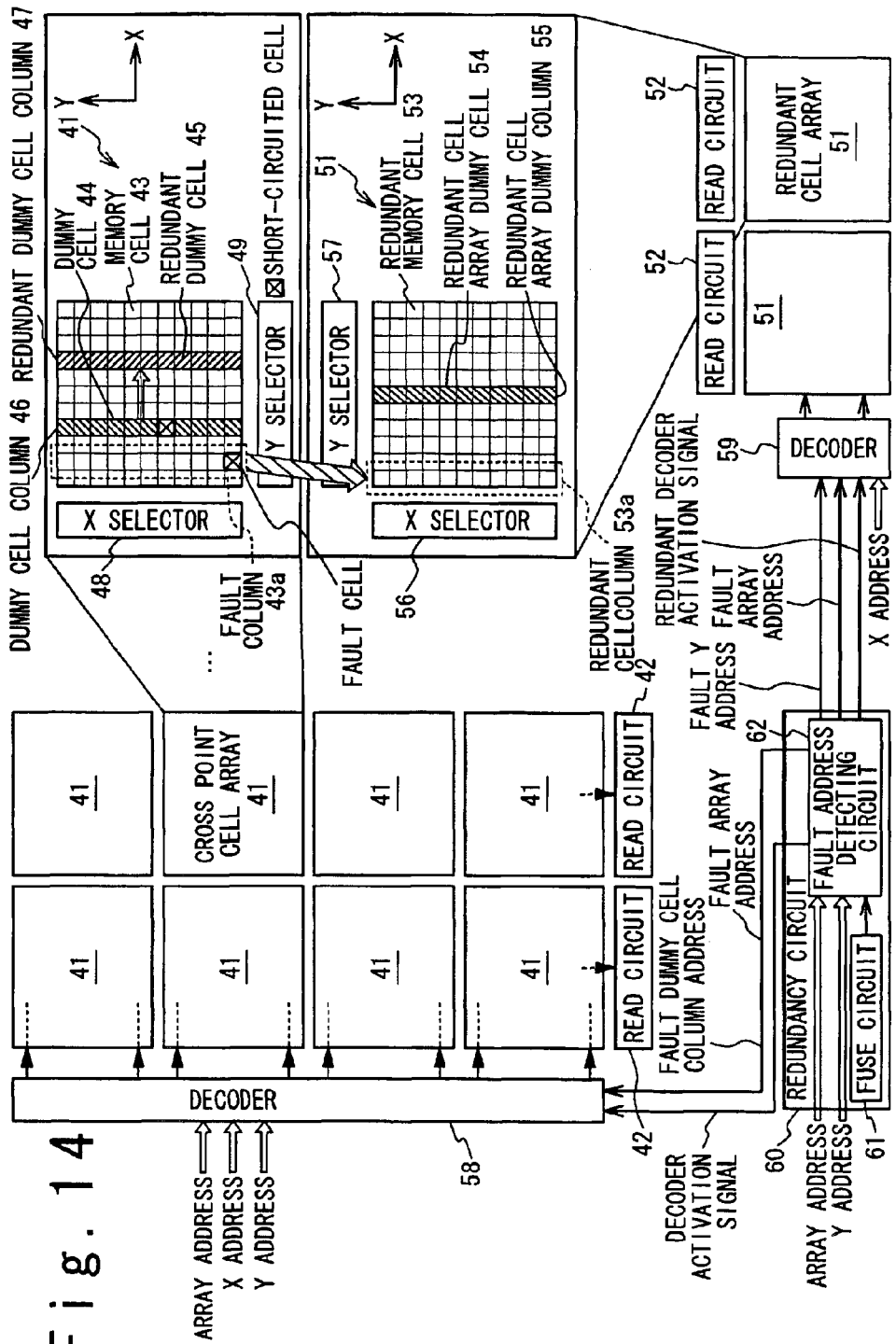
FIG. 14 is a diagram showing the magnetic random access memory according to a third embodiment of the present invention.

FIG. 14 shows the magnetic random access memory in the third embodiment. The magnetic random access memory in the third embodiment is composed of a plurality of cross point cell arrays 41 arranged in a matrix and read circuits 42. One read circuit 42 is provided for one column of cross point cell arrays 41. Each of the read circuits 42 has the same structure as the read circuit 16 in the first embodiment and is used to determine the data stored in the selected memory cell.

Each of the cross point cell arrays 41 is composed of the memory cells 43 arranged in a matrix, a plurality of word lines and a plurality of bit lines. However, for the convenience of easy understanding, the word lines and the bit lines are omitted and the memory cell 43 is shown as a square. The memory cell 43 is provided for the location where the word line and the bit line intersect. The memory cell 43 has the same structure as the memory cell 2 shown in FIG. 5 and contains a magnetic tunnel junction which is composed of a pin layer, a free layer, and a tunnel barrier layer interposed between the pin layer and the free layer. One column of the memory cells 43 arranged in line in the Y-direction is connected with a same bit line, and the memory cell column is composed of the memory cells 43 which are connected with one bit line.

The cross point cell array 41 is further composed of a dummy cell column 46 which is composed of the dummy cells 44 arranged in one line in the Y-direction direction (direction of the bit line) and a redundant dummy cell column 47 which is composed of the redundant dummy cells 45 arranged in one line in the Y-direction (the direction of the bit line). All the dummy cells 44 are connected with the dummy bit line (not illustrated) extending into the Y-direction and all the redundant dummy cells 45 are connected with a redundant dummy bit line (not illustrated) extending into the Y-direction. Both of the dummy cell column 46 and the redundant dummy cell column 47 are not in the end portion of the cross point cell array 41 but in the middle portion. That is, the dummy cell column 46 and the redundant dummy cell column 47 are inserted between the columns of the memory cells.

Like the first embodiment and the second embodiment, the dummy cells 44 contained in the dummy cell column 46 are used to generate the offset component electric current Ic which is used to remove an the offset component from the detection electric current Is which flows through the selected bit line. Like the first embodiment and the second embodiment, the electric current Is–Ic which is equivalent to the electric current obtained by subtracting the offset component electric current Ic from the detection electric current Is is generated and the determination of the data stored in the selected memory cell is carried out based on the electric current Is–Ic.

The redundant dummy cell column 47 is provided to substitute the dummy cell column 46 when the dummy cell column 46 contains a fault dummy cell such as a short-circuited cell. When the dummy cell column 46 contains the fault cell, the dummy cell column 46 does not play the function. In such a case, the redundant dummy cell column 47 is used instead of the dummy cell column 46, and the offset component electric current Ic is generated using the redundant dummy cell 45 contained in redundant dummy cell column 47.

The redundant dummy cell column 47 is provided for each of the cross point cell arrays 41. Thus, it is made possible to read data from the memory cell 43 contained in the cross point cell array 41 even when the dummy cell column 46 contains the fault cell. If the dummy cell column 46 of one cross point cell array 41 contains the fault cell when there is not the redundant dummy cell column 47, it is impossible to read data from all the memory cells 43 contained in the cross point cell array 41. This is because the dummy cell column 46 is used for the read operation to all the memory cells 43 contained in the cross point cell array 41. It is possible to avoid such a situation that the read operation becomes impossible when the dummy cell column 46 contains the fault cell, by providing the redundant dummy cell column 47 for each of the cross point cell arrays 41.

Moreover, the cross point cell array 41 is further composed of an X-selector 48 which selects one selected word line and a Y-selector 49 which selects one selected bit line. The Y-selector 49 connects the selected bit line and the dummy bit line with the read circuit 42. However, when the redundant dummy cell column 47 substitutes the dummy cell column 46, the Y-selector 49 connects the redundant dummy bit line connected with the redundant dummy cells 45 with the read circuit 42 instead of the dummy bit line connected with the dummy cells 44.

The magnetic random access memory in the third embodiment is further composed of a plurality of redundant cell arrays 51 and a redundant read circuit 52 for the purpose of carrying out the redundant relief of the memory cell 43 contained in the cross point cell array 41. The redundant cell array 51 is composed of redundant memory cells 53 arranged in a matrix, a plurality of redundant word lines extending into the X-direction and a plurality of redundancy bit lines extending into the Y-direction. However, for the convenience of easy understanding, redundant word lines and the redundancy bit lines are not illustrated. The redundant memory cells 53 are provided for the locations where the redundant word lines and the redundancy bit lines intersect, respectively. The redundant memory cell 53 has the same structure as the memory cell 2 shown in FIG. 5 and contains a magnetic tunnel junction which is composed of a pin layer, a free layer, and a tunnel barrier layer interposed between the pin layer and the free layer. The redundant memory cells 53 of one column extending in the Y-direction are connected with one same redundancy bit line. A plurality of redundant memory cell columns are contained in one redundant cell array 51.

The redundant memory cell column contained in redundant cell array 51 is used to substitute the memory cell column when the memory cell column containing a fault cell exists in the cross point cell array 41. When one memory cell column is a fault cell column containing the fault cell, it is impossible to read data from all the memory cells contained in the fault cell column. In such a case, instead of the fault cell column, the redundant memory cell column is used.

Moreover, the redundant cell array 51 is composed of redundant cell array dummy cells 54 extending into the Y-direction and a redundant dummy bit line (not illustrated) extending into the Y-direction. The redundant cell array dummy cell column 55 is composed of redundant cell array dummy cells 54. The redundant cell array dummy cell 54 has the same structure as the memory cell 2 shown in FIG. 5 and contains a magnetic tunnel junction which is composed of a pin layer, a free layer, and a tunnel barrier layer interposed between the pin layer and the free layer. The redundant cell array dummy cell 54 is provided for the location where the redundant word line and the redundant dummy bit line intersect and all the redundant cell array dummy cells 54 are connected with the redundant dummy bit line. The redundant cell array dummy cell 54 is used to remove the offset component from the detection electric current Is which flows through the selected bit line which is connected with the selected memory cell when one of the redundant memory cells 53 is selected as the selected memory cell. The redundant cell array dummy cell column 55 is not provided to substitute the dummy cell column 46, unlike the redundant dummy cell column 47. The redundant cell array dummy cell column 55 is not arranged in the end portion of the redundant cell array 51 but in the middle portion. That is, the redundant cell array dummy cell column 55 is inserted between the columns of the redundant memory cells.

Moreover, the redundant cell array 51 is composed of an X-selector 56 which selects one of the redundant word lines and a Y-selector 57 which selects one of the redundancy bit lines. The Y-selector 57 connects to the redundant read circuit 52, the selected bit line and the redundant dummy bit line with which the redundant cell array dummy cell 54 is connected.

The magnetic random access memory in the third embodiment is further composed of a decoder 58, a redundant decoder 59 and a redundancy circuit 60 which are provided to determine the selected memory cell to which the read operation is carried out while substituting the redundant memory cell column for the fault cell column and the selected dummy cell which is used for the generation of the offset component electric current.

The redundancy circuit 60 carries out a process of substituting the redundant memory cell column for the fault cell column contained in the cross point cell array 41. The redundancy circuit 60 contains a fuse circuit 61 and a fault address detecting circuit 62. The fuse circuit 61 contains fuse groups (not illustrated). The data showing a fault array address, a fault Y address and a fault dummy cell column address are recorded in the fuse groups. The fault array address is an address showing the cross point cell array 41 containing the fault cell column or the fault dummy cell column. The fault Y address is a Y address of the fault cell column. The fault dummy cell column address is an address showing the fault dummy cell column. The fault array address and the fault Y address is substitution data showing which of the memory cell columns is substituted by which of redundant cell columns. The fault array address and the fault dummy cell column address is substitution data showing which of the dummy cell columns 46 is substituted by which of the redundant dummy cell columns 47.

The fault address detecting circuit 62 recognizes the fault array address, the fault Y address and the fault dummy cell column address from the state of the fuse groups contained in fuse circuit 61. Moreover, the fault address detecting circuit 62 outputs a fault array address and a fault dummy cell column address to the decoder 58. Moreover, the fault address detecting circuit 62 determines which of the decoder 58 and the redundant decoder 59 should be activated, from the array address and the Y address. Based on the determination, the fault address detecting circuit 62 outputs a decoder activation signal to the decoder 58 to activate the decoder 58 and outputs a redundant decoder activation signal to the redundant decoder 59 to activate the redundant decoder 59.

The decoder 58 controls the X-selector 48 and the Y-selector 49 contained in the cross point cell array 41 to allow a read operation to the selected memory cell. The decoder 58 receives an array address, an X address, Y address, the fault array address, the fault dummy cell column address and the decoder activation signal. When the decoder 58 is activated in response to the decoder activation signal, one of the plurality of cross point cell arrays 41 is selected based on the array address, and the X-selector 48 and the Y-selector 49 contained in the selected memory cell array are activated. Moreover, the decoder 58 controls the activated X-selector 48 based on the X address to select one of the word lines. Moreover, the decoder 58 controls the activated Y-selector 49 based on the Y address to select one of the bit lines. Moreover, the decoder 58 instructs the activated Y-selector 49 to connect the read circuit 42 to one of the dummy bit line connected with the dummy cells 44 and the redundant dummy bit line connected with the redundant dummy cells 45 based on the fault dummy cell column address.

The redundant decoder 59 controls the X-selector 56 and the Y-selector 57 contained in the redundant cell array 51 to allow the read operation to the selected memory cell. The redundant decoder 59 receives the fault array address, the fault Y address, the X address and the redundant decoder activation signal. The redundant decoder 58 selects one of the plurality of redundant cell arrays 51 based on the fault array address and the fault Y address, when being activated in response to the redundant decoder activation signal. The redundant decoder 58 activates the X-selector 56 and the Y-selector 59 which are contained in the selected redundant cell array. Moreover, the redundant decoder 59 controls the activated X-selector 56 based on the X address to select one of the word lines. Moreover, the redundant decoder 59 controls the activated Y-selector 57 based on the fault array address and the fault Y address to select one of the selected bit lines.

The read operation of the magnetic random access memory in the third embodiment is carried out in accordance with the following process. The fault dummy cell column address, the fault array address and the fault Y address are generated by the fault address detecting circuit 62 in response to the state of the fuse groups contained in the fuse circuit 61. Moreover, which of the decoder 58 and the redundant decoder 59 should be activated is determined by the fault address detecting circuit 62 and the decoder activation signal or the redundant decoder activation signal is generated.

When the array address and the Y address specify as the selected memory cell, the memory cell 43 contained in the memory cell column which does not contain the fault cell, the decoder 58 is activated in response to the decoder activation signal. Moreover, one of the cross point cell arrays 41 is selected as the selected memory cell array based on the array address. Moreover, one of the word lines contained in the selected memory cell array is selected based on the X address and the one of the bit lines contained in the selected memory cell array is selected based on the Y address. The memory cell 43 connected with the selected word line and the selected bit line is selected as the selected memory cell. Moreover, one of the dummy cell column 46 contained in the cross point cell array 41 containing the selected memory cell and the redundant dummy cell column 47 is selected. When the data indicating that the dummy cell column 46 contains the fault cell is written in fuse circuit 61, the redundant dummy cell column 47 is selected and substituted for the dummy cell column 46. One connected with the selected word line, of the dummy cells 44 contained in the selected column (or the redundant dummy cell 45) is selected as the selected dummy cell.

The selected bit line connected with the selected memory cell and the dummy bit line (or the redundant dummy bit line) connected with the selected dummy cell are connected with the read circuit 49 through the Y-selector 49. The potential V2' is supplied to the selected bit line and the dummy bit line (or the redundant dummy bit line) by the read circuit 49. Moreover, the potential V1 is supplied to the selected word line by the X-selector 48. At this time, it is desirable from the viewpoint of the decrease of the sneak path electric current that the potential V2 which is the same as the potential V2' is supplied from the power supply line (not illustrated) electrically separated from the read circuit 49 to the non-selected bit lines.

Through the application of the potential V2' and the potential V1, the detection electric current Is flows through the selected bit line, and the offset component electric current Ic flows through the dummy bit line (or the redundant dummy bit line). The read circuit 49 determines the data stored in the selected memory cell based on the electric current Is–Ic corresponding to the difference between the detection electric current Is and the offset component electric current Ic. The determination of the stored data is carried out through the same process as the first embodiment. As described above, by determining the stored data based on the electric current Is–Ic, it is possible to cancel the offset component due to the short-circuited cell and to read data from the memory cell 43 connected with the same word line as the short-circuited cell.

On the other hand, when the array address and the Y address specify the memory cell 43 contained in the fault cell column 43a as the selected memory cell, the selected memory cell is selected from among the redundant memory cells 53 contained in the redundant cell column 53a which is substituted for the fault cell column 43a. In this case, the redundant decoder 59 is activated in response to the redundant decoder activation signal. Also, the redundant cell array 51 containing the redundant cell column 53a is selected as the selected memory cell array based on the fault array address and the fault Y address generated by the fault address detecting circuit 62. Moreover, the selected word line is selected from among the redundant word lines contained in the selected memory cell array based on the X address. Moreover, the redundancy bit line corresponding to the redundant cell column 53a is selected as the selected bit line based on the fault array address and the fault Y address. The redundant memory cell 53, connected with the selected word line and the selected bit line, of the redundant memory cells 53 contained in the redundant cell column 53a is selected as the selected memory cell. Moreover, the redundant dummy cell, connected with the selected word line, of the redundant cell array dummy cells 54 contained in the selected memory cell array is selected as the selection the dummy cell.

The operation after the selection of the selected memory cell and the selected dummy cell is same as described above.

The selected bit line connected with the selected memory cell and the redundant dummy bit line connected with the selected dummy cell are connected with the redundant read circuit 52 through the Y-selector 57. The potential V2' is supplied to the selected bit line and the redundant dummy bit line by the read circuit 52. Moreover, the potential V1 is supplied to the selected word line by the X-selector 56. At this time, it is desirable from the viewpoint of the decrease of the sneak path electric current that the same potential V2 as potential V2' is supplied from the power supply line (not illustrated) which is electrically separated from the read circuit 52 to the non-selected bit lines.

Through the application of the potential V2' and the potential V1, the detection electric current Is flows through the selected bit line and the offset component electric current Ic flows through the redundant dummy bit line. The read circuit 52 determines the data stored in the selected memory cell based on the electric current Is–Ic corresponding to the difference between the detection electric current Is and the offset component electric current Ic. The determination of the stored data is carried out in accordance with the same process as the first embodiment.

In the magnetic random access memory in the third embodiment described above, the redundant design is carried out in which the fault cell column is substituted by the redundant cell column, such that it is possible to read data from the normal memory cell connected with the same word line as the short-circuited cell, by determining the stored data based on the electric current Is–Ic. Moreover, by providing the redundant dummy cell column 47 for the cross point cell array 41 in addition to the dummy cell column 46, it is avoidable that it is impossible to read data from any of the memory cells 43 contained in the cross point cell array 41, even when the dummy cell column 46 contains a short-circuited cell.

Figure 15:
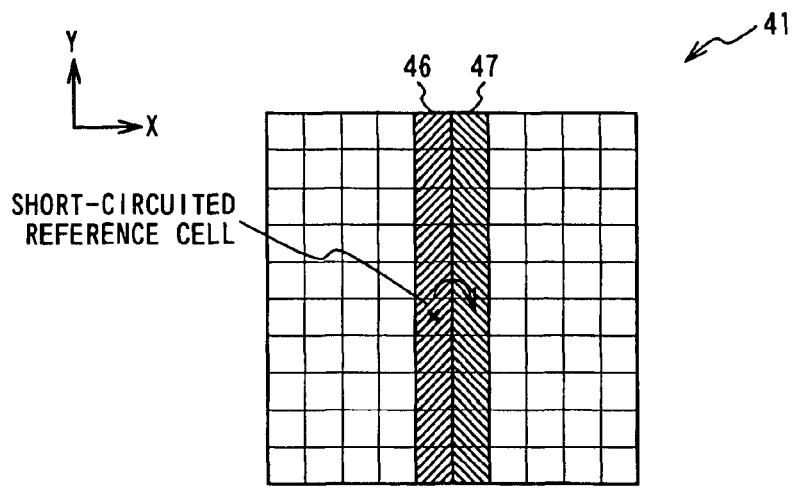
FIG. 15 is a diagram showing a modification example of the magnetic random access memory according to the third embodiment of the present invention.

In the magnetic random access memory in the third embodiment, the arrangement of the dummy cell column 46 and the redundant dummy cell column 47 may be changed. For example, as shown in FIG. 15, the dummy cell column 46 and the redundant dummy cell column 47 may be arranged such that they are adjacent to each other, and the number of the memory cell columns is equal to the number of redundant dummy cell columns 47. Such arrangement is desirable in minimization of a distance between the selected bit line and the dummy bit line (or the redundant dummy bit line), and from the viewpoint that the difference can be made small between the true value of the offset component contained in the detection electric current Is and the offset component electric current Ic.

Moreover, in the magnetic random access memory in the third embodiment, the nonvolatile memory may be used instead of the fuse circuit 61. In this case, data showing the fault array address, the fault Y address and the fault dummy cell column address is recorded in the nonvolatile memory.

Moreover, in the magnetic random access memory of the third embodiment, the reference cell and the reference dummy cell may be added to each of the cross point cell arrays 41 and the redundant cell array 51, like the second embodiment. The reference cell and the reference dummy cell are arranged in one line into the X-direction (the direction of the word line), and moreover, they are connected with the reference word line. In this case, the reference detection electric current Isref is generated using the selected reference cell selected from among the added reference cells, and the offset component electric current Icref is generated using the reference dummy cell. Moreover, the determination of the data stored in the selected memory cell is carried out in accordance with the same process as the second embodiment using the electric current Isref-Icref corresponding to the difference between the reference detection electric current Isref and the offset component electric current Icref in addition to the electric current Is−Ic.

Figure 16:
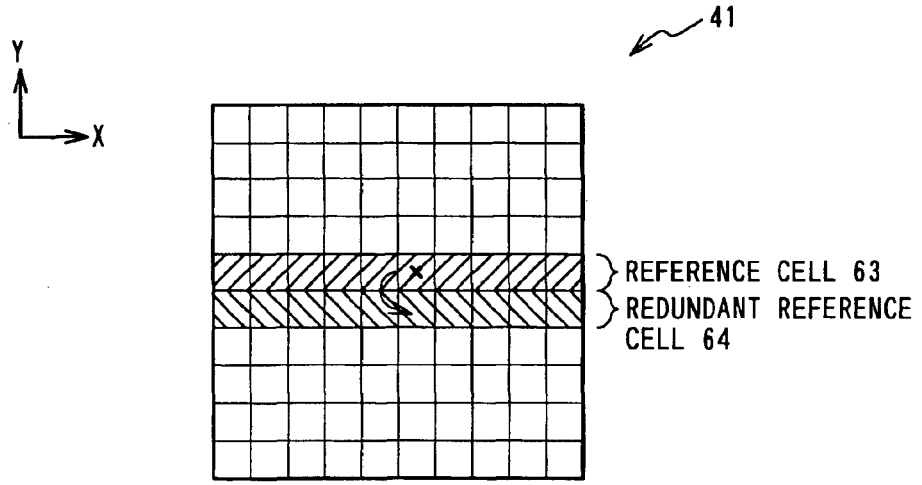
FIG. 16 is a diagram showing another modification example of the magnetic random access memory according to the third embodiment of the present invention.

As shown in FIG. 16, when the reference cell and the reference dummy cell are added, the redundant reference cells 64 arranged in one line in the X-direction (the direction of the word line) may be added to be substituted for the reference cell 63. The redundant reference cell 64 is connected with the redundant reference word line. In this case, substitution data showing whether the reference cell column of the reference cells 63 should be substituted by the redundant reference cell column of the redundant reference cells 64 is stored in the above-mentioned fuse circuit 61. The redundancy circuit 60 controls the decoder 58 and the redundant decoder 59 in response to the substitution data for the reference cell column to be substituted by the redundant cell column. When one reference cell 63 is a fault cell, the redundant reference cell 64 connected with the same bit line as the reference cell 63 is used instead of the reference cell 63 and the reference detection electric current Isref is generated. In this case, it is desirable that the column of the reference cells 63 and the column of redundant reference cells 64 are located in the center portion of the cross point cell array 41 (or redundant cell array 51).

(Fourth Embodiment)

Figure 17:
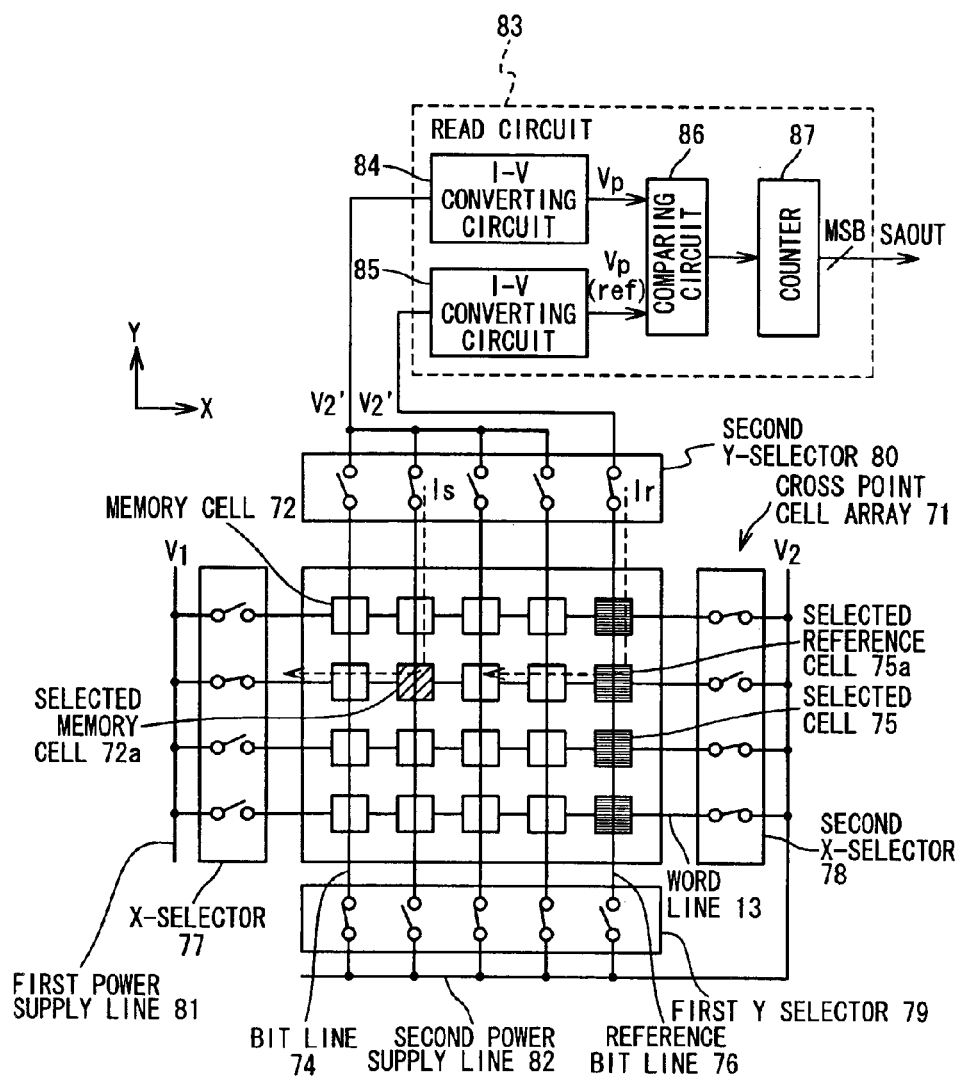
FIG. 17 is a diagram showing the magnetic random access memory according to a fourth embodiment of the present invention.

FIG. 17 shows a magnetic random access memory in the fourth embodiment of the present invention. The magnetic random access memory in the fourth embodiment uses the technique different from the techniques in the first to third embodiments to improve the reliability of the determination of the data stored in the memory cell.

The magnetic random access memory in the fourth embodiment is composed of the cross point cell array 71. The cross point cell array 71 contains a plurality of memory cells 72, a plurality of word lines 73 extending into the X-direction (the direction of the word line) and a plurality of bit lines 74 extending into the Y-direction (the direction of the bit line).

The structure of the memory cell 72 is the same as the memory cell 2 shown in FIG. 5 and contains a magnetic tunnel junction which is composed of a pin layer, a free layer, and a tunnel barrier layer interposed between the pin layer and the free layer. The direction of the spontaneous magnetization of the pin layer of the memory cell 72 is fixed into the X-direction (the direction of the word line). The direction of the spontaneous magnetization of the free layer of the memory cell 72 is changeable or invertible and is permitted to turn to the same direction as the direction the spontaneous magnetization of the pin layer (parallel direction) and to turn the opposite direction to the direction the spontaneous magnetization of the pin layer (anti-parallel direction). The memory cell 72 is arranged in the intersection of the word lines 73 and the bit lines 74 and each of the memory cells 72 is interposed between the word line 73 and the bit line 74 which intersect in the memory cell 72.

Moreover, the cross point cell array 71 contains the reference cells 75 arranged in line in the Y-direction (the direction of the bit line) and the reference bit lines 76 extending to the Y-direction. Like the reference cell 31 in the second embodiment, one of "1" and "0" is fixedly written in the reference cell 75, and the reference cell 75 is used for the generation of the reference voltage. However, it should be noted that the reference cells 75 are arranged in line in the Y-direction (the direction of the bit line), different from the reference cells 31 in the second embodiment. The reference cell 75 is arranged in the location where the word line 3 and the reference bit line 76 intersect and each of the reference cells 75 is interposed between the word line 73 and the reference bit line 76.

Figure 18:
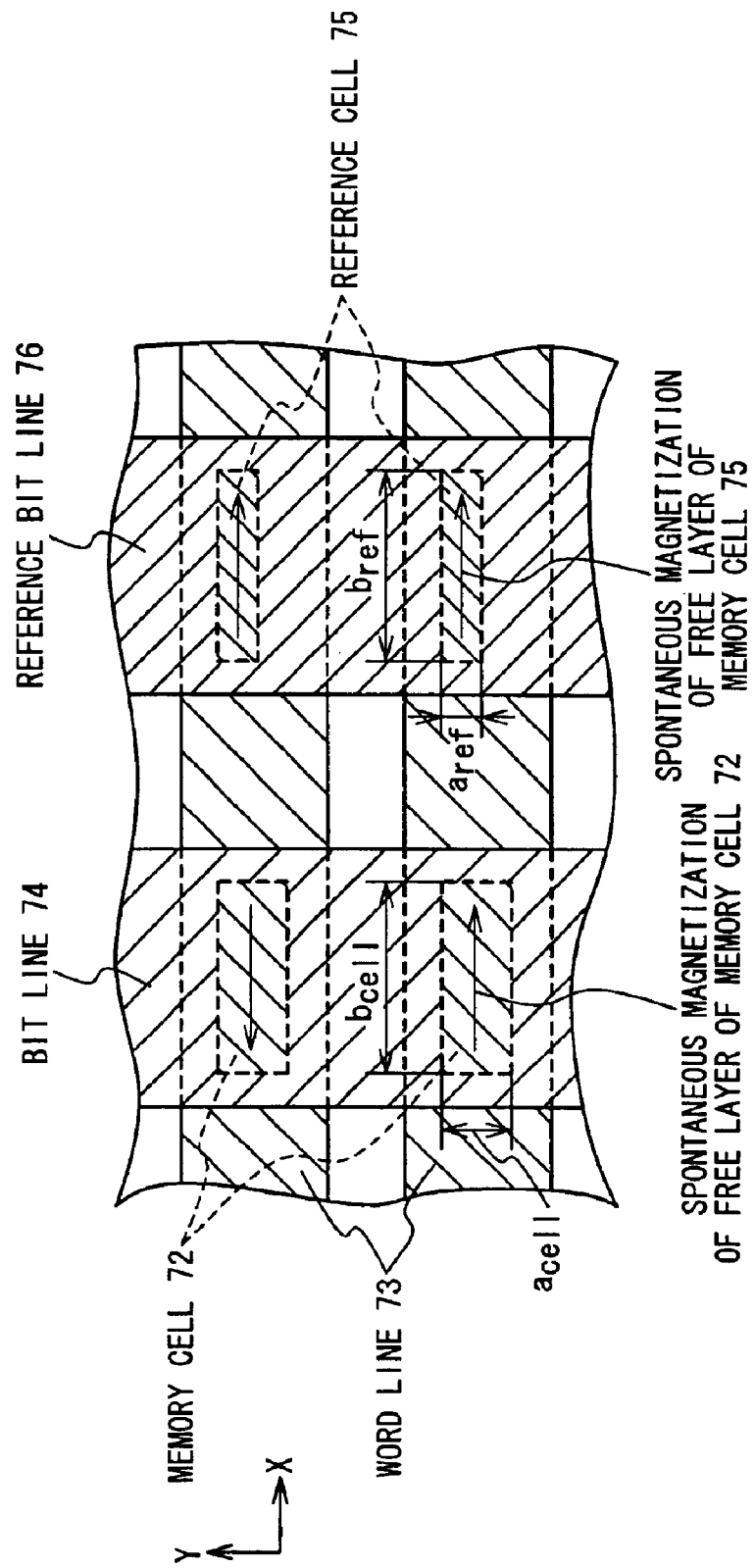
FIG. 18 is a diagram showing the structure of a memory cell and a reference cell.

As shown in FIG. 18, the area of the free layer of the reference cell 75 is different from the area of the free layer of the memory cell 72, and the area of the free layer of the reference cell 75 is smaller than the area of the free layer of the memory cell 72. Thus, the resistance Rref of the reference cell 75 is adjusted so that the resistance Rref is between the two resistance values R and R+ΔR which the memory cell 72 can take.

It is desirable from the viewpoint of prevention of accidental inversion of the data stored in the reference cell 75 that the free layer of the reference cell 75 has the small area. The free layer contained in the reference cell 75 has a central region showing a property like a bulk and a circumferential region where the property like the bulk is lost. The spontaneous magnetization of the free layer is mainly derived from the central region. When the area of the free layer of the reference cell 75 is small, the influence of the circumferential region on the central region becomes large and the spontaneous magnetization of the free layer is difficult to turn over. It is desirable from the viewpoint of the stable reference voltage that the spontaneous magnetization of the reference cell 75 used for the generation of the reference voltage is difficult to turn over.

The free layer of the memory cell 72 and the free layer of the reference cell 75 have a thin shape into the X-direction as it is easy for the spontaneous magnetization to turn into the X-direction (the direction of the word line). However, the free layer of the reference cell 75 has a spindlier shape into the X-direction, comparing with the free layer of the memory cell 72. That is, the following equation (2) is met:

$$a_{ref}/b_{ref} < a_{cell}/b_{cell} \tag{2}$$

where $b_{ref}$ is the length of the free layer of the reference cell 75 into the X-direction, $a_{ref}$ is the width of the free layer of the reference cell 75 into the Y-direction, $b_{cell}$ is the length of the free layer of the memory cell 72 into the X-direction, and $a_{cell}$ is the width of the free layer of the memory cell 72 into the Y-direction.

More specifically, the free layer of the memory cell 72 and the free layer of the reference cell 75 are formed such that the length $b_{cell}$ of the free layer of the memory cell 72 into the X-direction and the length $b_{ref}$ of the free layer of the reference cell 75 into the X-direction are substantially the same, and the width $a_{ref}$ of the free layer of the reference cell 75 into the Y-direction is smaller than the width $a_{cell}$ of the free layer of the memory cell 72 into the Y-direction. In this way, because the free layer of the reference cell 75 has the shape spindlier into the X-direction than the free layer of the memory cell 72, the direction of the spontaneous magnetization of the reference cell 75 is restricted to the X-direction more strongly, resulting in stabilization of the state of the reference cell 75. The stabilization of the state of the reference cell 75 is desirable in the viewpoint that the generation of the stable reference voltage is possible.

Moreover, the cross point cell array 71 contains the first X-selector 77, the second X-selector 78, the first Y-selector 79 and the second Y-selector 80. The first X-selector 77 and the second X-selector 78 are connected with the word lines 73 and select the selected word line from among the word lines 73. The first Y-selector 79 and the second Y-selector 80 are connected with the bit lines 74 and select the selected bit line from among the bit lines 74. One of the memory cells 72 which is connected with the selected word line and the selected bit line is selected as a selected memory cell 72a. Moreover, one of the reference cells 75 which is connected with the selected word line is selected as a selected reference cell 75a. The selected reference cell 75a is used to determine the data stored in the selected memory cell 72a, to be described later.

More specifically, the first X-selector 77 connects the selected word line of the word lines 73 with the first power supply line 81 which has the potential V1 and separates the non-selected word lines from the first power supply line 81. The second X-selector 78 connects the non-selected word lines with the second power supply line 82 which has the potential V2 and separates the selected word line from the second power supply line 82. Thus, the potential V1 is supplied to the selected word line and the potential V2 is supplied to the non-selected word lines.

The first Y-selector 79 connects the non-selected bit lines of the bit lines with the above-mentioned second power supply line 82 and separates the selected bit line from the second power supply line 82. Thus, the same potential V2 as being applied to the non-selected word lines is supplied to the non-selected bit lines. The sneak path electric current can be restrained effectively through the supply of the same potential V2 to the non-selected bit lines and the non-selected word lines. It is desirable from the viewpoint of improvement of coincidence of the potential supplied to the non-selected bit lines and the non-selected word lines that the second power supply line 82 is used in common as the voltage source for supplying the non-selected bit lines and the non-selected word lines with the potential V2. The second Y-selector 80 connects the selected bit line and the reference bit line 76 with the read circuit 83 and separates the non-selected bit lines from the read circuit 83.

The determination of the data stored in the selected memory cell 72a is carried out by the read circuit 83. The read circuit 83 holds the selected bit line and the reference bit line 76 to substantially the same potential V2' as the potential V2 of the second power supply line 82 when the data stored in the selected memory cell 72a is determined. Through the application of the potential V2' to the selected bit line, the voltage V2'-V1 is applied between the selected bit line and the selected word line, and the detection electric current Is flows through the selected bit line. Moreover, through the application of the potential V2' to the reference bit line 76, the voltage V2'-V1 is applied between the reference bit line 76 and the selected word line, and the reference electric current Ir flows through the reference bit line 76. The sneak path electric current which flows through the cross point cell array 71 can be decreased effectively, by equalizing the potential V2 applied to the non-selected bit lines and the potential V2' applied to the selected bit line and the reference bit line 76.

The read circuit 83 compares the detection electric current Is which flows through the selected bit line and the reference electric current Ir which flows through the reference bit line 76 to determine the data stored in the selected memory cell 72a. The resistance value of the selected memory cell 72a changes in accordance with the data stored in the selected memory cell 72a. Therefore, the detection electric current Is changes in accordance with the stored data. The read circuit 83 determines the data stored in the selected memory cell 72a from the result of the comparison of the detection electric current Is and the reference electric current Ir and outputs the data signal SAOUT showing the content of the stored data.

The read circuit 83 typically contains the I-V converting circuits 84 and 85, the comparator 86 and the counter 87.

The I-V converting circuit 84 is connected with the selected bit line through the second Y-selector 80 and the I-V converting circuit 85 is connected with the reference bit line 76 through the second Y-selector 80. The I-V converting circuit 84 converts the detection electric current Is into a detection potential Vp and the I-V converting circuit 85 converts the reference electric current Ir into a reference potential Vp(ref).

Figure 19:
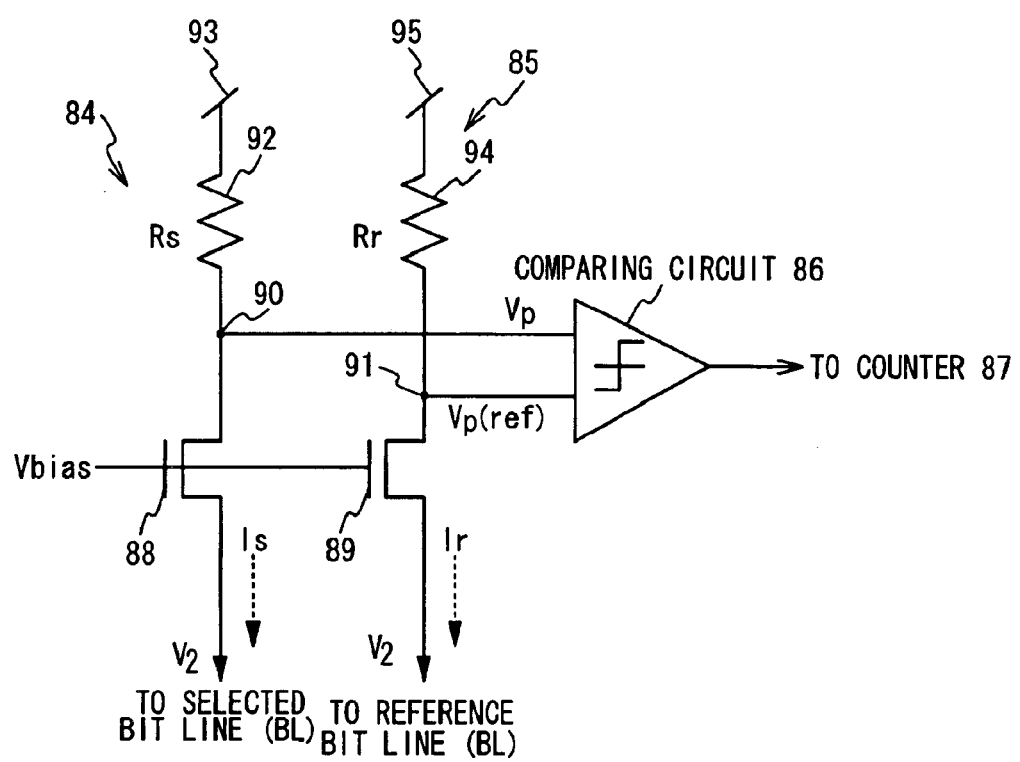
FIG. 19 is a circuit diagram showing an I-V converting circuit.

FIG. 19 shows the typical I-V converting circuits 84 and 85. The I-V converting circuit 84 contains an NMOS transistor 88 and a resistor 92. The source of NMOS transistor 88 is connected with the selected bit line through the second Y-selector 80. The potential Vbias is supplied to the gate of the NMOS transistor 88. By controlling the potential Vbias appropriately, the selected bit line is held to the potential V2'. The drain of the NMOS transistor 88 is connected with an output node 90. The output node 90 is connected through the resistor 92 with the power supply terminal 93 which has the power supply potential Vcc. The detection electric current Is flows through the resistor 92, the NMOS transistor 88 and the selected bit line from the voltage terminal 93. The potential drop across the resistor 92 changes in response to the detection electric current Is and the potential at the output node 90 changes in response to the detection electric current Is. The potential of the output node 90 is outputted from the comparator 86 as a detection voltage Vp.

The I-V converting circuit 85 has a structure similar to the I-V converting circuit 84 and contains an NMOS transistor 89 and a resistor 94. The source of the NMOS transistor 89 is connected with the reference bit line 76 through the second Y-selector 80. The potential Vbias is supplied to the gate of the NMOS transistor 89, and by controlling the potential Vbias appropriately, the reference bit line 76 is held to the potential V2'. The drain of the NMOS transistor 89 is connected with an output node 91. The output node 91 is connected through the resistor 94 with the power supply terminal 95 which has the power supply potential Vcc. The reference electric current Ir flows through the resistor 94, the NMOS transistor 89 and the reference bit line 76 from a voltage terminal 95. Thus, the potential drop of the resistor 94 changes in response to the reference electric current Ir, and the potential of the output node 91 changes in response to the reference electric current Ir. The potential of the output node 91 is outputted by the comparator 86 as the reference voltage Vp(ref).

The comparator 86 compares the detection voltage Vp and the reference voltage Vp(ref). The comparator 86 determines the data stored in the selected memory cell 72a by comparing the detection voltage Vp and the reference voltage Vp(ref). The comparator 86 outputs "1" when the detection voltage Vp is equal to or higher than the reference voltage Vp(ref), and outputs "0" when the detection voltage Vp is lower than the reference voltage Vp(ref). However, it should be noted that the data determined by the comparator 86 is not always coincident with the data determined by the read circuit 83 as data stored in the selected memory cell 72a, to be described later.

The counter 87 is a counter which holds a value of n bits (n is an integer equal to or more than 2). The counter 87 increases the holding value by one every time the counter 87 receives "1" from the comparator 86. The most significant bit (MSB) of the value held by the counter 87 is outputted as a data signal SAOUT.

Next, a read operation of the magnetic random access memory in the fourth embodiment will be described. As shown in FIG. 20, in the fourth embodiment, the read operation to the selected memory cell 72a is carried out $2^n-1$ times to prevent an erroneous read operation of the data due to the sneak path electric current. An example when n=4 and the read operation is carried out 15 times is shown in FIG. 20. In case of each of the read operations, the detection electric current Is is read out from the selected memory cell 72a and the reference electric current Ir is read out from the selected reference cell 75a. Moreover, the detection voltage Vp is generated from the detection electric current Is and the reference voltage Vp(ref) is generated from the reference electric current Ir. The comparator 86 determines that the data stored in the selected memory cell 72a is "1" when the detection voltage Vp is higher than the reference voltage Vp(ref) and the comparator 86 outputs "1" to the counter 87. On the other hand, the comparator 86 determines that the data stored in the selected memory cell 72a is "0" when the detection voltage Vp is lower than the reference voltage Vp(ref) and outputs "0" to the counter 87.

If the number of times of the output of "0" by the comparator 86 is large in the read operation of $2^n-1$ times to the selected memory cell 72a, the most significant bit (MSB) of the n-bit value held by the counter 87 becomes "0", and the data signal SAOUT is set to "0" and is outputted. Thus, the read circuit 83 determines that the data stored in the selected memory cell 72a is "0". On the other hand, if the number of times of the output of "1" by the comparator 86 is large "1", the most significant bit (MSB) of the n-bit value held by the counter 87 becomes "1", the data signal SAOUT is set to "1" and is outputted. Thus, the read circuit 83 determines that the data stored in the selected memory cell 72a is "1".

As described above, in this embodiment, the certainty of the determination of the data stored in the selected memory cell 72a is improved through repetition of the read operation to the selected memory cell 72a. Therefore, it is possible to carry out the read operation to the memory cell which has a MR ratio not as sufficiently large as about several %. It is desirable that the number of times of the read operation to the selected memory cell 72a is an odd time, from the viewpoint that the determination of the data stored in the selected memory cell 72a can be carried out based on the majority determination.

In this embodiment, it is possible to compensate the read result by using ECC (Error Checking and Correcting) technique. The compensation for the read result by the ECC technique is suitable in the viewpoint that the certainty of the determination of the stored data can be improved more.

Moreover, the number of times of the read operation which is carried out to the selected memory cell 72a may be except $2^n-1$ times. In this case, the counter 87 outputs the data signal SAOUT as "0" if the number of times when the comparator 86 outputs "0" is more than the number of times which the comparator 86 outputs "1", and outputs the data signal SAOUT as "1" if the number of times when the comparator 86 outputs "1" more than the number of times when the comparator 86 outputs "0".

However, when the counter 87 is the n-bit counter and the number of times of the read operation to the selected memory cell 72a is $2^n-1$ times, the operation in which the most significant bit MSB of the value held by the counter 87 is outputted as the data signal SAOUT becomes equivalent to the operation that the comparator 86 compares the number of times of the output of "1" and the number of times of the output of "0". This is suitable in the point that the circuit structure of the read circuit 83 can be simplified.

In the fourth embodiment, the reference cell 75 may have the same structure as the memory cell 72. In this case, the resistance value Rs of the resistor 92 contained in the I-V converting circuit 84 and the resistance value Rr of the resistor 94 contained in the I-V converting circuit 85 are adjusted to meet the following equation:

$$Vp(0)<Vp(\text{ref})<Vp(1). \tag{3}$$

By decreasing the resistance value Rr smaller than the resistance Rs, the equation (3) can be met.

However, it is preferable that the area of the reference cell 75 and the area of the memory cell 72 is different and the area of the reference cell 75 is smaller than the area of the memory cell 72, like this embodiment. Because the area of the reference cell 75 and the area of the memory cell 72 are different from each other, the I-V converting circuits 84 and 85 may have the same circuit structure to improve the symmetry. Therefore, it improves the sensitivity of the comparison between the detection electric current Is and the reference the electric current Ir to keep the symmetry of the I-V converting circuits 84 and 85, resulting in improvement of the reliability of the determination of the data stored in the selected memory cell 72a.

As described above, according to the present invention, a technique is provided to determine the data stored in the memory cell of the magnetic random access memory in the high reliability.

Also, in accordance with the present invention, the technique is provided that the data stored in the memory cell of the magnetic random access memory can be determined in a high reliability while the influence of the sneak path electric current is restrained.

What is claimed is:

1. A magnetic random access memory comprising:
   a cross point cell array of memory cells arranged in a matrix of columns and rows, each of said memory cells having a magneto-resistance element;
   a column of dummy memory cells, each of said dummy memory cells having a magneto-resistance element;
   word lines provided for said rows of said memory cells and said dummy memory cells, respectively;
   bit lines provided for said columns of said memory cells, respectively;
   a dummy bit line provided for said column of dummy memory cells; and
   a read circuit connected with said cross point cell array and said dummy bit line,
   wherein a selected memory cell as one of said memory cells is connected with a selected word line and a selected bit line, and a selected dummy memory cell is connected with said dummy bit line and said selected word line, and
   when said selected memory cell is selected from among said memory cells in a read operation, said read circuit determines data stored in said selected memory cell using a difference between a detection electric current which flows through said selected bit line, said selected memory cell and said selected word line and a dummy bit line electric current which flows through said dummy bit line and said selected dummy memory cell.

2. The magnetic random access memory according to claim 1, wherein a first voltage is applied from said read circuit to said selected bit line and said dummy bit line, and a second voltage is applied to said selected word line.

3. The magnetic random access memory according to claim 2, further comprising:
   a first selector interposed between said read circuit and said cross point cell array to select said selected bit line from among said bit lines such that said selected bit line and said dummy bit line are connected with said read circuit, and non-selected bit lines as ones of said bit lines other than said selected bit line are not connected with said read circuit.

4. The magnetic random access memory according to claim 2, further comprising:

a second selector connected with said word lines to select said selected word line from among said word lines such that the first voltage is applied to said selected word line and is not applied to non-selected word lines as ones of said word lines other than said selected word lines.

5. The magnetic random access memory according to claim 3, wherein said non-selected bit lines are set to a floating state.

6. The magnetic random access memory according to claim 3, wherein said non-selected bit lines are applied with a third voltage, and said third voltage is substantially the same as said first voltage.

7. The magnetic random access memory according to claim 6, further comprising:

a third selector connected with said bit lines and said dummy bit line to select said non-selected bit lines, wherein said third voltage is applied to said non-selected bit lines, and is not applied to said selected bit line and said dummy bit line.

8. The magnetic random access memory according to claim 1, wherein said read circuit comprises:

a removing circuit provided to generate a difference signal corresponding to the difference between said detection electric current and said dummy bit line electric current; and a data determining circuit which determines the data stored in said selected memory cell using said difference signal.

9. The magnetic random access memory according to claim 8, wherein said data determining circuit comprises:

an electric current-voltage converting circuit which outputs an output voltage corresponding to said difference signal; and a determining circuit which determines the data stored in said memory cell using said output voltage.

10. The magnetic random access memory according to claim 1, further comprising:

a column of redundant dummy cells;

a redundant dummy bit line provided for said column of redundant dummy cells; and a redundant circuit which contains a substitution data holding unit which holds substitution data, wherein said redundant circuit connects said column of redundant dummy cell to said read circuit based on said substitution data instead of said dummy cell column.

11. The magnetic random access memory according to claim 1, wherein said column of dummy memory cells is interposed between said columns of memory cells.

12. The magnetic random access memory according to claim 10, wherein said column of redundant dummy memory cells is interposed between said columns of memory cells.

13. The magnetic random access memory according to claim 1, further comprising:

a row of reference memory cells connected with said bit lines and said dummy bit line, each of said reference memory cells having a magneto-resistance element and storing predetermined data; and a reference word line provided for said row of reference memory cells, wherein when one of said reference memory cells connected with said bit lines is selected, said reference memory cell connected with said dummy bit line is a reference dummy memory cell, said read circuit determines the data stored in said selected memory cell using a difference between a reference detection electric current which flows through said selected bit line, said selected reference memory cell and said reference word line and a reference dummy bit line electric current which flows through said dummy bit line, said reference dummy memory cell and said reference word line, in addition to the difference between said detection electric current and said dummy bit line electric current.

14. The magnetic random access memory according to claim 13, wherein said read circuit comprises:

a removing circuit provided to generate a difference signal corresponding to the difference between said detection electric current and said dummy bit line electric current, and to generate a reference difference signal corresponding to the difference between said reference detection electric current and said reference dummy bit line electric current; and a data determining circuit which determines the data stored in said selected memory cell based on said difference signal and said reference difference signal.

15. The magnetic random access memory according to claim 14, wherein said data determining circuit comprises:

an electric current-voltage converting circuit which outputs a first output voltage corresponding to said difference signal and a second output voltage corresponding to said reference difference signal;

a holding circuit which holds said first output voltage; and a determining circuit which determines the data stored in said memory cell based on said first output voltage from said holding circuit and said second output voltage.

16. The magnetic random access memory according to claim 1, wherein said read circuit comprises:

a first electric current-voltage converting circuit which outputs a first output voltage corresponding to said detection electric current in said read operation;

a second electric current-voltage converting circuit which outputs a second output voltage corresponding to said dummy bit line electric current in said read operation;

a comparing circuit which compares said first output voltage and said second output voltage and selectively output a predetermined data based on the comparison result in said read operation; and a determining circuit which determines the data stored in said selected memory cell based on the number of times of the output of said predetermined data from said comparing circuit.

17. The magnetic random access memory according to claim 16, wherein the number of times of said read operation is odd times.

18. The magnetic random access memory according to claim 17, wherein in said read operation, said read circuit determines that the data stored said memory cell is "1" when the number of times when the data stored in said memory cell is determined as "1" is equal to or more than when the number of times when the data stored in said memory cell is determined as "0", and determines that the data stored said memory cell is "1" when the number of times when the data stored in said memory cell is determined as "1" is equal to or more than when the number of times when the data stored in said memory cell is determined as "0".

19. The magnetic random access memory according to claim 16, wherein said determining circuit contains a counter of n bits, the number of times of said read operation is $2^n-1$ times, said counter is incremented by one every time the data stored in said memory cell is determined as "1", said counter outputs the most significant bit as the data stored in said selected memory cell after $2^n-1$ times of said read operation is carried out.

20. The magnetic random access memory according to claim 16, wherein said reference memory cell has a reference cell free layer for holding said predetermined data based on a direction of spontaneous magnetization of said reference cell free layer, said memory cell has a memory cell free layer for holding the data based on a direction of spontaneous magnetization of said memory cell, and said reference memory cell free layer and said memory cell free layer are different in area size from each other.

21. The magnetic random access memory according to claim 20, wherein said reference memory cell free layer is smaller in area than said memory cell free layer.

22. The magnetic random access memory according to claim 21, wherein the following equation is met:

$$a_{ref}/b_{ref} < a_{cell}/b_{cell}$$

where $b_{cell}$ is a length of said memory cell free layer in a direction of said spontaneous magnetization of said memory cell free layer, $a_{cell}$ is a length of said memory cell free layer in direction perpendicular to the direction of said spontaneous magnetization of said memory cell free layer, $b_{ref}$ is a length of said reference memory cell free layer in a direction of said spontaneous magnetization of said reference memory cell free layer, and $a_{ref}$ is a length of said reference memory cell free layer of in direction perpendicular to the direction of said spontaneous magnetization of said reference memory cell free layer.

23. The magnetic random access memory according to claim 21, wherein a resistance value of said reference memory cell is selected to be between a larger resistance value of a resistance value of said memory cell and a smaller resistance value.

24. A magnetic random access memory comprising:

a plurality of cells, each of which has invertible spontaneous magnetization and contains a magnetoresistance element whose resistance changes depending on a direction of said spontaneous magnetization; and a read circuit, wherein said plurality of cells contain memory cells, each of which has a memory cell free layer storing a data of "1" or "0" depending on a direction of spontaneous magnetization of said memory cell free layer, and reference cells, each of which has a reference cell free layer storing a predetermined data depending on a direction of spontaneous magnetization of said reference cell, said reference cell free layer and said memory cell free layer are different in area size from each other, said read circuit takes out memory cell electric current from said memory cell, and reference cell electric current from said reference cell, and determines the data stored in said memory cell based on said memory cell electric current and said reference cell electric current.

25. The magnetic random access memory according to 24, wherein said reference cell free layer is smaller in area than said memory cell free layer.

26. The magnetic random access memory according to claim 25, wherein the following equation is met:

$$a_{ref}/b_{ref} < a_{cell}/b_{cell}$$

where $b_{cell}$ is a length of said memory cell free layer in a direction of said spontaneous magnetization of said memory cell free layer, $a_{cell}$ is a length of said memory cell free layer in direction perpendicular to the direction of said spontaneous magnetization of said memory cell free layer, $b_{ref}$ is a length of said reference cell free layer in a direction of said spontaneous magnetization of said reference cell free layer, and $a_{ref}$ is a length of said reference cell free layer of in direction perpendicular to the direction of said spontaneous magnetization of said reference cell free layer.

27. The magnetic random access memory according to claim 25, wherein a resistance value of said reference memory cell is selected to be between a larger resistance value of a resistance value of said memory cell and a smaller resistance value.

28. A magnetic random access memory comprising:

a plurality of cross point cell arrays arranged in a matrix;

a decoder provided for said plurality of cross point cell arrays to decode an address; and a plurality of read circuits, each of which is provided for one column of said plurality of cross point cell arrays, wherein each of said plurality of cross point cell arrays comprises:

memory cells arranged in a matrix of columns and rows, each of said memory cells having a magneto-resistance element;

a column of dummy memory cells, each of said dummy memory cells having a magneto-resistance element;

word lines provided for said rows of said memory cells and said dummy memory cells, respectively;

bit lines provided for said columns of said memory cells, respectively;

a dummy bit line provided for said column of dummy memory cells;

a first selector provided to select a selected word line as one of said word lines based on a decoding result of said decoder and to connect said selected bit line and said dummy bit line with said read circuit; and a second selector provided to select a selected bit line as one of said bit lines and said dummy bit line based on the decoding result of said decoder, wherein a selected memory cell as one of said memory cells is connected with said selected word line and said selected bit line, a selected dummy memory cell is connected with said selected word line, ones of said word lines other than said selected word line are non-selected word lines, ones of said bit lines other than said selected bit line are non-selected bit lines, and one of said memory cells other than said selected memory cell are non-selected memory cells, and when said selected memory cell is selected from among said memory cells in one of said plurality of cross point cell arrays in a read operation, said read circuit determines data stored in said selected memory cell using a difference of a detection electric current which flows through said selected bit line, said selected memory cell and said selected word line and a dummy bit line electric current which flows through said dummy bit line, said selected dummy memory cell and said selected word line.

29. The magnetic random access memory according to claim 28, wherein said read circuit applies a first voltage is applied to said selected bit line and said dummy bit line, and does not apply said first voltage to said non-selected bit lines, and said first selector applies a second voltage is applied to said selected word line and does not apply said second voltage to said non-selected word lines.

30. The magnetic random access memory according to claim 29, wherein said non-selected bit lines are set to a floating state.

31. The magnetic random access memory according to claim 29, further comprising:

a third selector provided to apply a third voltage to said non-selected bit lines, wherein said third voltage is substantially the same as said first voltage.

32. The magnetic random access memory according to claim 28, wherein each of said cross point cell arrays further comprises:

a column of redundant dummy cells;

a redundant dummy bit line provided for said column of redundant dummy cells; and a redundant circuit which contains a substitution data holding unit which holds substitution data, wherein said redundant circuit connects said redundant dummy cell column to said read circuit based on said substitution data instead of said dummy cell column.

33. The magnetic random access memory according to claim 28, wherein said column of dummy memory cells is interposed between said columns of memory cells of each of said cross point cell arrays.

34. The magnetic random access memory according to claim 32, wherein said column of redundant dummy memory cells is interposed between said columns of memory cells of each of said cross point cell arrays.

35. The magnetic random access memory according to claim 28, each of said cross point cell arrays further comprises:

a row of reference memory cells connected with said bit lines and said dummy bit line, each of said reference memory cells having a magneto-resistance element, and storing predetermined data; and a reference word line provided for said row of reference memory cells.

36. The magnetic random access memory according to claim 35, wherein when one of said reference memory cells connected with said bit lines is selected, said reference memory cell connected with said dummy bit line is a reference dummy memory cell, said read circuit determines data stored in said selected memory cell using a difference of a reference detection electric current which flows through said selected bit line and said selected reference memory cell and a reference dummy bit line electric current which flows through said dummy bit line and said selected reference dummy memory cell, in addition to the difference of said detection electric current which flows through said selected bit line and said selected memory cell and said dummy bit line electric current which flows through said dummy bit line and said selected dummy memory cell.

37. The magnetic random access memory according to claim 28, further comprising:

a plurality of redundant cell arrays;

a redundancy circuit;

a redundant decoder; and a redundant read circuit provided for each of plurality of redundant cell arrays, wherein each of said plurality of redundant cell arrays comprises:

redundant memory cells arranged in a matrix of columns and rows, each of said redundant memory cells having a magneto-resistance element;

a column of redundant dummy memory cells, each of said redundant dummy memory cells having a magneto-resistance element;

redundant word lines provided for said rows of said memory cells and said redundant dummy memory cells, respectively;

redundant bit lines provided for said columns of said redundant memory cells, respectively;

a redundant dummy bit line provided for said column of redundant dummy memory cells;

a first redundant selector provided to select a selected redundant word line as one of said redundant word lines based on a decoding result of said decoder and to connect said selected redundant bit line and said redundant dummy bit line with said redundant read circuit; and a second redundant selector provided to select a selected redundant bit line as one of said redundant bit lines and said redundant dummy bit line based on the decoding result of said redundant decoder, said redundancy circuit comprises a fuse circuit which holds a substitution data, and activates one of said plurality of redundant cell arrays when said substitution data and a part of said address are coincident with each other.

38. A method of read data from a selected memory cell in a magnetic random access memory, comprising:

applying first and second voltages to said selected memory cell and a selected dummy memory cell, wherein said selected memory cell is connected with a selected bit line and a selected word line, and said selected dummy memory cell is connected with a dummy bit line and said selected word line;

calculating a first difference of a first detection electric current which flows through said selected bit line, said selected memory cell and said selected word line and a first dummy bit line electric current which flows through said dummy bit line, said selected dummy memory cell and said selected word line;

converting said first difference into a first output voltage and holding said first output voltage;

writing one of predetermined two data in said selected memory cell;

applying said first and second voltages to said selected memory cell and said dummy memory cell;

calculating a second difference of a second detection electric current which flows through said selected bit line and said selected memory cell and a second dummy bit line electric current which flows through said dummy bit line and said selected dummy memory cell;

converting said second difference into a second output voltage;

comparing said first output voltage and said second output voltage;

when said first output voltage is coincident with said second output voltage, outputting said one predetermined data; and when said first output voltage is not coincident with said second output voltage, outputting said other predetermined data and writing said other predetermined data into said selected memory cell.

39. A method of read data from a selected memory cell in a magnetic random access memory, comprising:

applying first and second voltages to said selected memory cell and a first selected dummy memory cell, wherein said selected memory cell is connected with a selected bit line and a first selected word line, and said first selected dummy memory cell is connected with a dummy bit line and said first selected word line;

calculating a first difference of a first detection electric current which flows through said selected bit line, said selected memory cell and said first selected word line and a first dummy bit line electric current which flows through said dummy bit line, said selected dummy memory cell and said first selected word line;

converting said first difference into a first output voltage and holding said first output voltage;

applying said first and second voltages to a selected reference memory cell and a second selected dummy memory cell, wherein said selected reference memory cell is connected with said selected bit line and a second selected word line, and said second selected dummy memory cell is connected with said dummy bit line and said second selected word line;

calculating a second difference of a second detection electric current which flows through said selected bit line, said selected reference memory cell and said second selected word line and a second dummy bit line electric current which flows through said dummy bit line, said second selected dummy memory cell and said second selected word line;

converting said second difference into a second output voltage;

comparing said first output voltage and said second output voltage; and outputting one of predetermined two data based on the comparing result.

40. A method of reading data from a selected memory cell in a magnetic random access memory, comprising:

(a) applying first and second voltages to said selected memory cell and a selected dummy memory cell, wherein said selected memory cell is connected with a selected bit line and a selected word line, and said selected dummy memory cell is connected with a dummy bit line and said selected word line;

(b) converting into a first voltage, a detection electric current which flows through said selected bit line, said selected memory cell and said selected word line;

(c) converting into a second voltage, a first dummy bit line electric current which flows through said dummy bit line, said selected dummy memory cell and said selected word line;

(d) outputting "1" when said first voltage is equal to or larger than said second voltage;

(e) counting up a count by one;

carrying out (a) to (e) an odd times; and determining that the data stored in said selected memory cell is "1" when the number of times when the data stored in said selected memory cell is determined as "1" is equal to or more than when the number of times when the data stored in said memory cell is determined as "0" and determining that the data stored said memory cell is "1" when the number of times when the data stored in said memory cell is determined as "1" is equal to or more than when the number of times when the data stored in said memory cell is determined as "0".

* * * * *